(12) United States Patent
Lin et al.

(10) Patent No.: US 11,004,738 B2
(45) Date of Patent: May 11, 2021

(54) CAPACITANCE REDUCTION BY METAL CUT DESIGN

(71) Applicant: Taiwan Semiconductor Manufacturing Co., Ltd., Hsinchu (TW)

(72) Inventors: Yi-Hsiung Lin, Zhubei (TW); Yu-Xuan Huang, Hsinchu (TW); Chih-Ming Lai, Hsinchu (TW); Ru-Gun Liu, Zhubei (TW); Shang-Wen Chang, Jhubei (TW); Yi-Hsun Chiu, Zhubei (TW)

(73) Assignee: Taiwan Semiconductor Manufacturing Co., Ltd.

(*) Notice: Subject to any disclaimer, the term of this patent is extended or adjusted under 35 U.S.C. 154(b) by 72 days.

(21) Appl. No.: 16/531,232

(22) Filed: Aug. 5, 2019

(65) Prior Publication Data
US 2020/0098631 A1    Mar. 26, 2020

Related U.S. Application Data

(60) Provisional application No. 62/734,709, filed on Sep. 21, 2018.

(51) Int. Cl.
*H01L 21/768* (2006.01)
*G06F 30/394* (2020.01)

(52) U.S. Cl.
CPC ...... *H01L 21/76892* (2013.01); *G06F 30/394* (2020.01)

(58) Field of Classification Search
CPC ............ H01L 21/76892; H01L 23/528; H01L 21/76816; H01L 21/76897; H01L 21/76895; H01L 27/0207; G06F 30/394
See application file for complete search history.

(56) References Cited

U.S. PATENT DOCUMENTS

| | | | | |
|---|---|---|---|---|
| 7,469,396 B2 * | 12/2008 | Hayashi | ............ | H01L 27/0207 716/119 |
| 8,319,257 B2 * | 11/2012 | Hayashi | ............ | H01L 27/0207 257/202 |
| 8,875,067 B2 * | 10/2014 | Hsu | ............ | G03F 1/70 716/54 |
| 9,026,973 B2 * | 5/2015 | Tien | ............ | G06F 30/00 716/122 |
| 9,380,709 B2 * | 6/2016 | Hsu | ............ | H01L 21/3213 |
| 9,551,923 B2 * | 1/2017 | Wang | ............ | H01L 27/0207 |

(Continued)

*Primary Examiner* — John P. Dulka
(74) *Attorney, Agent, or Firm* — Sterne, Kessler, Goldstein & Fox P.L.L.C.

(57) ABSTRACT

The present disclosure describes a method for forming metal interconnects in an integrated circuit (IC). The method includes placing a metal interconnect in a layout area, determining a location of a redundant portion of the metal interconnect, and reducing, at the location, the length of the metal interconnect by a length of the redundant portion to form one or more active portions of the metal interconnect. The length of the redundant portion is a function of a distance between adjacent gate structures of the IC. The method further includes forming the one or more active portions on an interlayer dielectric (ILD) layer of the IC and forming vias on the one or more active portions, wherein the vias are positioned about 3 nm to about 5 nm away from an end of the one or more active portions.

20 Claims, 14 Drawing Sheets

(56) References Cited

U.S. PATENT DOCUMENTS

| | | | | |
|---|---|---|---|---|
| 10,121,702 B1* | 11/2018 | Park | ............... | H01L 21/76897 |
| 10,340,357 B2* | 7/2019 | Chen | ............... | H01L 29/401 |
| 10,483,226 B2* | 11/2019 | Ku | ............... | H01L 24/13 |
| 10,672,708 B2* | 6/2020 | Fan | ............... | H01L 29/66545 |
| 10,691,849 B2* | 6/2020 | Lei | ............... | H01L 23/52 |
| 10,777,579 B2* | 9/2020 | Iwahori | ............... | H01L 21/823871 |
| 10,867,867 B2* | 12/2020 | Chiang | ............... | H01L 21/3086 |
| 10,868,003 B2* | 12/2020 | Wen | ............... | H01L 21/28079 |
| 2005/0077550 A1* | 4/2005 | Inaba | ............... | H01L 27/0924 |
| | | | | 257/250 |
| 2005/0199915 A1* | 9/2005 | Kuroki | ............... | H01L 27/11898 |
| | | | | 257/213 |
| 2005/0274983 A1* | 12/2005 | Hayashi | ............... | H01L 27/0207 |
| | | | | 257/206 |
| 2007/0109832 A1* | 5/2007 | Hou | ............... | G11C 5/063 |
| | | | | 365/63 |
| 2009/0031267 A1* | 1/2009 | Ueki | ............... | G06F 30/394 |
| | | | | 716/119 |
| 2009/0085067 A1* | 4/2009 | Hayashi | ............... | H01L 27/0207 |
| | | | | 257/202 |
| 2017/0125357 A1* | 5/2017 | Trester | ............... | H01L 23/5286 |
| 2018/0323258 A1* | 11/2018 | Tseng | ............... | H01L 29/7802 |
| 2019/0096811 A1* | 3/2019 | Wang | ............... | H01L 23/535 |
| 2019/0371655 A1* | 12/2019 | Hsiao | ............... | H01L 21/76877 |
| 2019/0371819 A1* | 12/2019 | Iwahori | ............... | H01L 27/0924 |
| 2020/0098631 A1* | 3/2020 | Lin | ............... | G06F 30/394 |
| 2020/0134128 A1* | 4/2020 | Peng | ............... | G06F 30/392 |
| 2020/0135637 A1* | 4/2020 | Peng | ............... | H01L 21/76877 |
| 2020/0144287 A1* | 5/2020 | Jung | ............... | H01L 21/76895 |
| 2020/0176448 A1* | 6/2020 | Huang | ............... | H01L 21/743 |

* cited by examiner

CAPACITANCE REDUCTION BY METAL CUT DESIGN

CROSS-REFERENCE TO RELATED APPLICATIONS

This application claims the benefit of U.S. Provisional Patent Application No. 62/734,709, titled "Capacitance Reduction by Metal Cut Design," filed Sep. 21, 2018, the disclosure of which is incorporated by reference herein in its entirety.

BACKGROUND

The semiconductor integrated circuit (IC) industry has experienced exponential growth. In semiconductor IC design, metal interconnect layers (e.g., M0 and M1) of semiconductor devices transmit electrical signals amongst different devices on a chip. A metal interconnect layer can be connected to another structure, such as a metal interconnect layer of an upper layer or a lower layer through vias. As ICs continue to scale down, a greater number of metal interconnects are arranged in a device area, increasing the density of metal interconnects in this area. Consequently, due to scaling down, parasitic capacitances in a device area can increase accordingly, thus impacting the speed of the device.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

FIGS. 12A-16A illustrate plan views of an interconnect layer with a layout of metal interconnects in an IC at various stages of its fabrication process, in accordance with some embodiments.

FIGS. 12B-16B illustrate isometric views of an interconnect layer with a layout of metal interconnects in an IC at various stages of its fabrication process, in accordance with some embodiments.

DETAILED DESCRIPTION

Figures 1A, 1B:
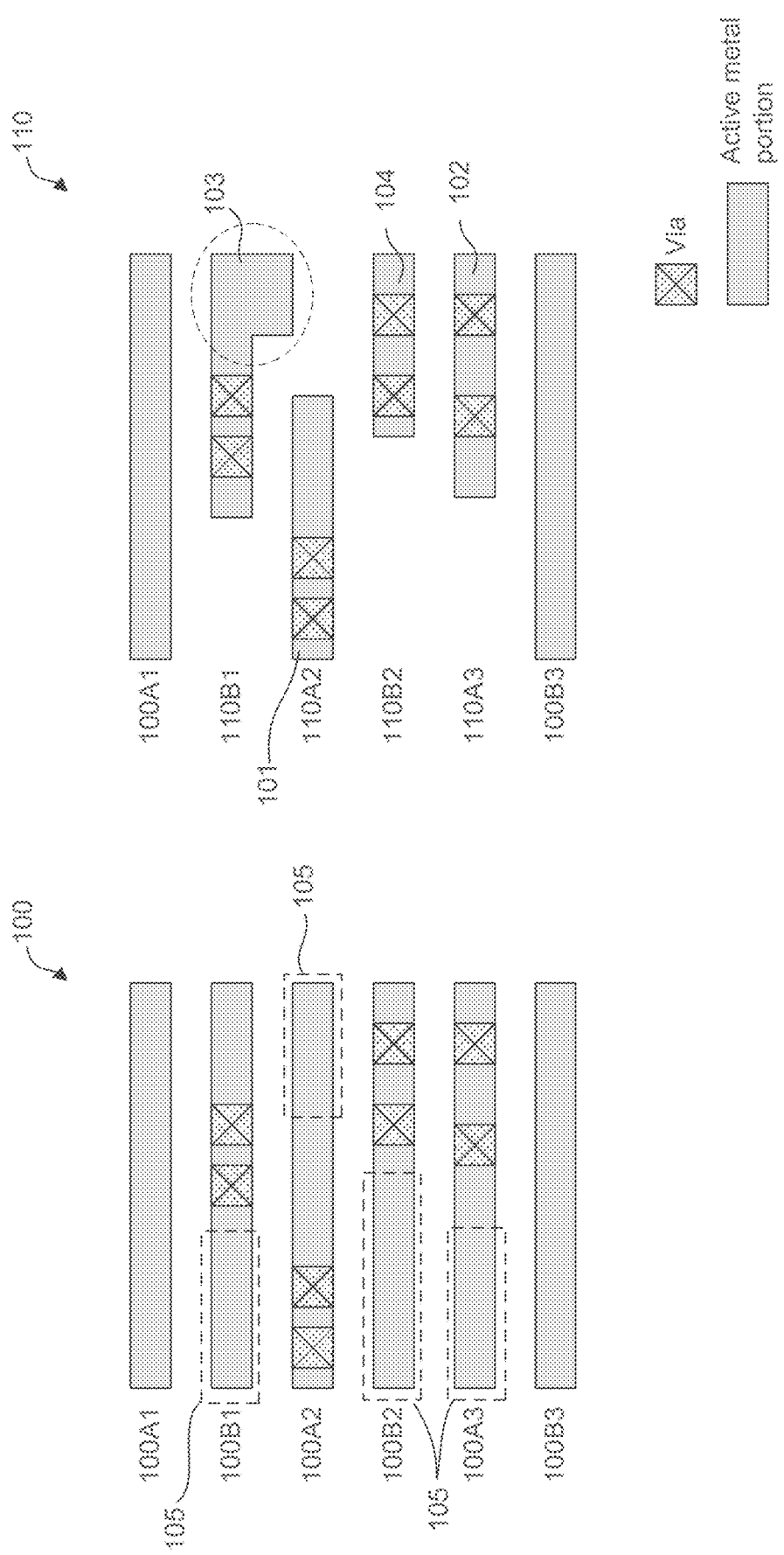
FIGS. 1A-1B illustrate a layout view of metal interconnects in an integrated circuit (IC).

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

In some embodiments, the terms "about" and "substantially" can indicate a value of a given quantity that varies within 5% of the value (e.g., ±1%, ±2%, ±3%, ±4%, ±5% of the value).

In semiconductor IC design, as ICs continue to scale down, the number of metal interconnects in an interconnect layer over the device area of an IC are increasing. To allow more metal interconnects to be formed over the device area, metal interconnects can be formed using a multi-patterning process. In a multi-patterning process, at least two batches of metal interconnects are patterned consecutively. To avoid short circuits between these metal interconnects formed by the multi-patterning process, the pattern of metal interconnects of a later batch can be formed by, e.g., a self-alignment process using the pattern of metal interconnects of an earlier batch. The metal interconnects formed can include redundant metal portions (also referred to as floating metal portions), e.g., portions of the metal interconnects that are functionless and have no electrical connection to other parts in the device area. These redundant metal portions can increase the parasitic capacitance of the ICs, causing the ICs to slow down.

Efforts have been made to reduce parasitic capacitance in ICs. One way is to remove or electrically disconnect the redundant metal portions from the ICs. The redundant metal portions are removed if their lengths are smaller than one gate pitch and electrically disconnected if their lengths are equal or greater than two gate pitches. One gate pitch can be defined as a distance between centerlines of two adjacent gates of the IC. The gate pitch can be referred to as a poly pitch or polysilicon gate pitch. The redundant metal portions can be removed or electrically disconnected from the circuit layout during circuit layout design process and the circuit layout can be subsequently transferred into an interlayer dielectric (ILD) layer during IC fabrication process. However, due to the small distance between adjacent metal interconnects, the redundant metal portions are often removed before the self-alignment process. As a result, the remaining portions of the metal interconnects (e.g., active metal portions) may not have sufficient length for the self-alignment process, causing misalignment of metal interconnects in the subsequent IC fabrication process or formation of undesired structures of metal interconnects. Such misalignment or formation of undesired structures can adversely affect the uniformity of critical dimensions (CDs) (e.g., dimensions of the smallest geometrical features) of the circuit. The non-uniformity in the CDs of the circuit can result in additional parasitic capacitance in the circuit, and consequently, the capacitance of the resultant ICs may not be reduced effectively. Also, the removal of the redundant metal portions produces empty spaces between adjacent metal interconnects, which introduces constraints on the location of vias on the active metal portions due to limitations in IC fabrication. For example, vias on active metal portions adjacent to an empty space are formed at least about 15 nm away from the ends of the active metal portions. Such constraints on via locations can limit the density of vias in the IC, which can limit the number of electrical connections between IC devices through metal interconnects and vias, thus limiting the density of IC devices.

FIGS. 1A and 1B illustrate the removal of redundant metal portions in a layout of metal interconnects. FIG. 1A illustrates a layout 100 of metal interconnects 100A1-100A3 and 100B1-100B3 with redundant metal portions 105 (enclosed in dashed lines), and FIG. 1B illustrates a layout 110 of metal interconnect 100A1, 100B1, 110A2-110A3, and 110B1-110B2 after the removal of redundant metal portions 105 from layout 100. Metal interconnects 100A1-100A3 and 100B1-100B3 can be arranged along a Y-axis (e.g., the vertical direction) and can extend along an X-axis (e.g., the horizontal direction). Metal interconnects 100A1-100A3 can be patterned by a first patterning process, and metal interconnects 100B1-100B3 can be patterned by a second patterning process following the first patterning process.

Patterning process can refer to an IC patterning process using, for example, lithography, etching, and/or deposition processes. Patterns of the metal interconnect layouts discussed herein can be made on an ILD layer using a lithography process on masking layers (shown in an example IC fabrication process with reference to FIGS. 11, 12A-16A, and 12B-16B). These patterns can be subsequently transferred to the ILD layer using etching processes, followed by deposition processes to form an interconnect layer with the layout of metal interconnects (shown in an example IC fabrication process with reference to FIGS. 11, 12A-16A, and 12B-16B). The interconnect layer can be formed on active devices (e.g., finFETs or MOSFETs) with some metal portions (e.g., active metal portions) of metal interconnects electrically connected to contact structures (e.g., source/drain contact structures and/or gate contact structures) of the active devices through vias. Vias in FIGS. 1A-1B can represent vias underlying or overlying the interconnect layer. Some of the metal interconnects (e.g., metal interconnects 100A1 or 100B3) can be electrically connected to VDD (e.g., power supply) and GND (e.g., ground).

Metal interconnects 100B1-100B3 can be patterned through a self-aligning process based on the patterns of metal interconnects 100A1-100A3. Metal can be deposited over the patterns of metal interconnects 100A1-100A3 and 100B1-100B3 to form metal interconnects 100A1-100A3 and 100B1-100B3, and vias can be formed before and/or after the formation of metal interconnects 100A1-100A3 and 100B1-100B3. Layout 100 of metal interconnects A1-A3 and B1-B3 without metal cut can then be formed, as shown in FIG. 1A.

FIG. 1B illustrates layout 110 of metal interconnects after the removal of redundant metal portions 105 of layout 100 during a circuit layout design process and/or an IC patterning process. The discussion of layout 100 and metal interconnects 100A2-100A3 and 100B1-100B2 applies to layout 110 and metal interconnects 110A2-110A3 and 110B1-110B2, respectively, unless mentioned otherwise. Elements 101, 102, 103, and 104 represent the remaining metal portions of metal interconnects 110A2-110A3 and 110B1-110B2, respectively, after the removal of redundant metal portions 105 shown in FIG. 1A. The remaining metal portions after the removal and/or electrical disconnection of redundant metal portions 105 can be referred to as active metal portions. Due to the compact arrangement of metal interconnects in layout 110, patterns of the redundant metal portions 105 in metal interconnects 110A2-110A3 can be removed during the first patterning process. The patterns of metal interconnects 100A1, 101, and 102 are retained for self-aligning of metal interconnects 110B1-110B2 and 100B3 during the second patterning process. Because substantial portions of the patterns of metal interconnects 110A2-110A3 have been removed, when the active metal portions of metal interconnects 110B1-110B3 (e.g., 103 and 104) are formed by the self-alignment process based on patterns of metal interconnects 100A1 and active metal portions 101-102, the patterns of active metal portions 103-104 can deviate from the alignment of the original design. For example, active metal portion 103 can include an excessive portion (as circled by the dashed lines) of metal due to the removal of redundant metal portion 105 of metal interconnect 110A2. The excessive portion of metal can alter the CD of the IC and the CD uniformity of the circuit can be impaired. As a result, the non-uniform CD can result in additional parasitic capacitance in the circuit, and consequently, lower the speed of the resultant IC.

Embodiments of the present disclosure provide methods to remove and/or electrically disconnect redundant metal portions of metal interconnects to form active metal portions of metal interconnects in a circuit layout and subsequently, fabricate the circuit layout in an interconnect layer to reduce parasitic capacitance of an IC and improve the speed of the IC. The methods can be performed at the design stage of the circuit layout for the IC and/or at the IC fabrication stage.

In some embodiments, electrically disconnecting redundant metal portions of metal interconnects can result in the formation of small floating metal portions positioned between adjacent active metal portions in the circuit. The electrical disconnection can be made by metal cuts in the circuit layout (shown in FIG. 2A) and by insulating portions during the IC patterning process (shown in an example IC fabrication process with reference to FIGS. 11, 12A-16A, and 12B-16B). The small floating metal portions can be equal to about one gate pitch and can electrically isolate the adjacent active metal portions. Vias on adjacent active metal portions electrically separated by the small floating metal portions can be formed about 3 nm to about 5 nm away from the active metal portion ends facing the small floating metal portions. This distance of the vias is smaller than the distance of the vias formed on adjacent active metal portions separated by insulating portions of one gate pitch, where vias can be formed about 15 nm or more away from the ends facing the insulating portions. Such constraints on the via locations can be because the active metal portion ends formed facing the insulating portions are more rounded than the active metal portion ends formed facing the small floating metal portions. Thus, the metal interconnect layouts and the methods for forming the layouts in interconnect layers provided in the present disclosure improve via density of the IC, which improves IC device density, and hence the speed of the IC.

In some embodiments, the removal of redundant metal portions can result in the formation of active metal portions with sufficiently long length. The formation of floating metal portions can allow more redundant metal portions to be electrically disconnected from the active metal portions, and the removal of redundant metal portions can allow the subsequent self-alignment process to be performed efficiently. Accordingly, metal interconnects formed by the disclosed methods can align along the horizontal direction (e.g., along an X-axis), and the metal interconnects can have structures, shapes, and/or dimensions as designed. Further, the disclosed methods help to maintain CD uniformity of the circuit and to reduce the parasitic capacitance of the IC, which can help to increase the device speed of the IC and reduce the power consumption of the IC. Thus, device performance can be improved by the disclosed methods. In some embodiments, by using the disclosed methods in the back end of the line (BEOL) stage of IC fabrication, capacitance of the IC can be reduced by about 50% and the speed of the IC can be increased by about 5 to about 10 times compared to circuits having metal interconnects patterned using redundant metal portion removal methods described in FIG. 1B. Further, embodiments of the disclosed methods can be used in the fabrication of devices at various process technology nodes, such as 5 nm and 7 nm fabrication processes.

The disclosed patterns of metal interconnects can include different sets of patterns for forming metal interconnects in two sequential patterning processes. For example, 200A1-200A3 and 210A1-210A3 are referred to as a first set of metal interconnects, and 200B1-200B3 and 210B1-210B3 are referred to as a second set of metal interconnects. The first set of metal interconnects and the second set of metal interconnects can be formed in two-step multi-patterning process in a subsequent IC fabrication process. In some embodiments, layout 200 can also be formed in other patterning process, such as shown in an example IC fabrication process with reference to FIGS. 11, 12A-16A, and 12B-16B. More sets of metal interconnects can also be patterned by placing more patterns (e.g., a third set and/or a fourth set) of metal interconnects in the circuit layout (not shown). The active metal portions of the first set of metal interconnects are referred to as the first active metal portions, and the active metal portions of the second set of metal interconnects are referred to as the second active metal portions. The redundant metal portions of the first set of metal interconnects are referred to as first redundant metal portions, and the redundant metal portions of the second set of metal interconnects are referred to as second redundant metal portions. In the present disclosure, the terms such as "first" and "second" are used merely for distinguishing different elements and are not intended to indicate any differences (e.g., in functions) amongst the elements.

Figure 2A:
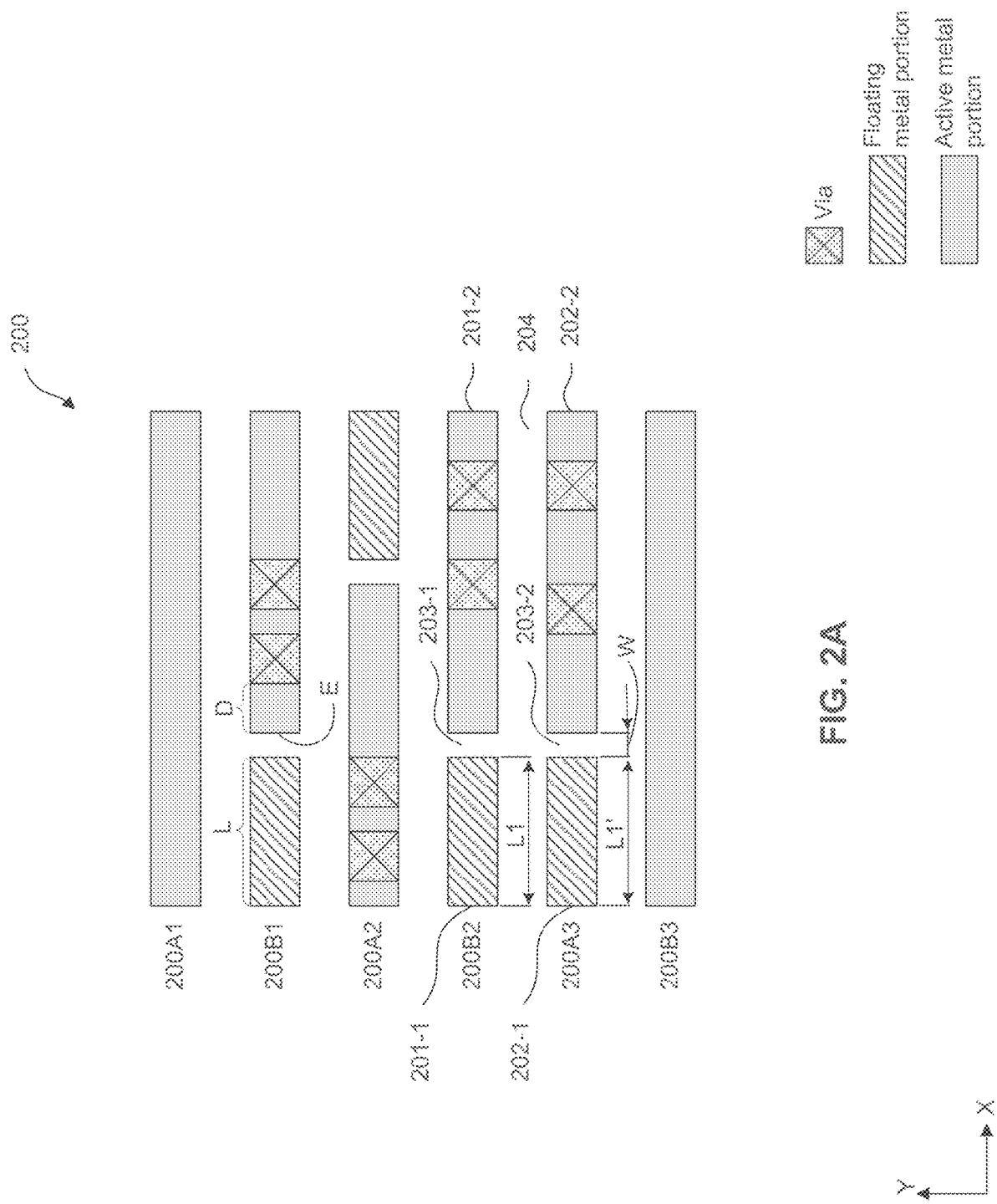
FIGS. 2A-2B illustrate a layout view of metal interconnects in an IC, in accordance with some embodiments.
Figure 2B:
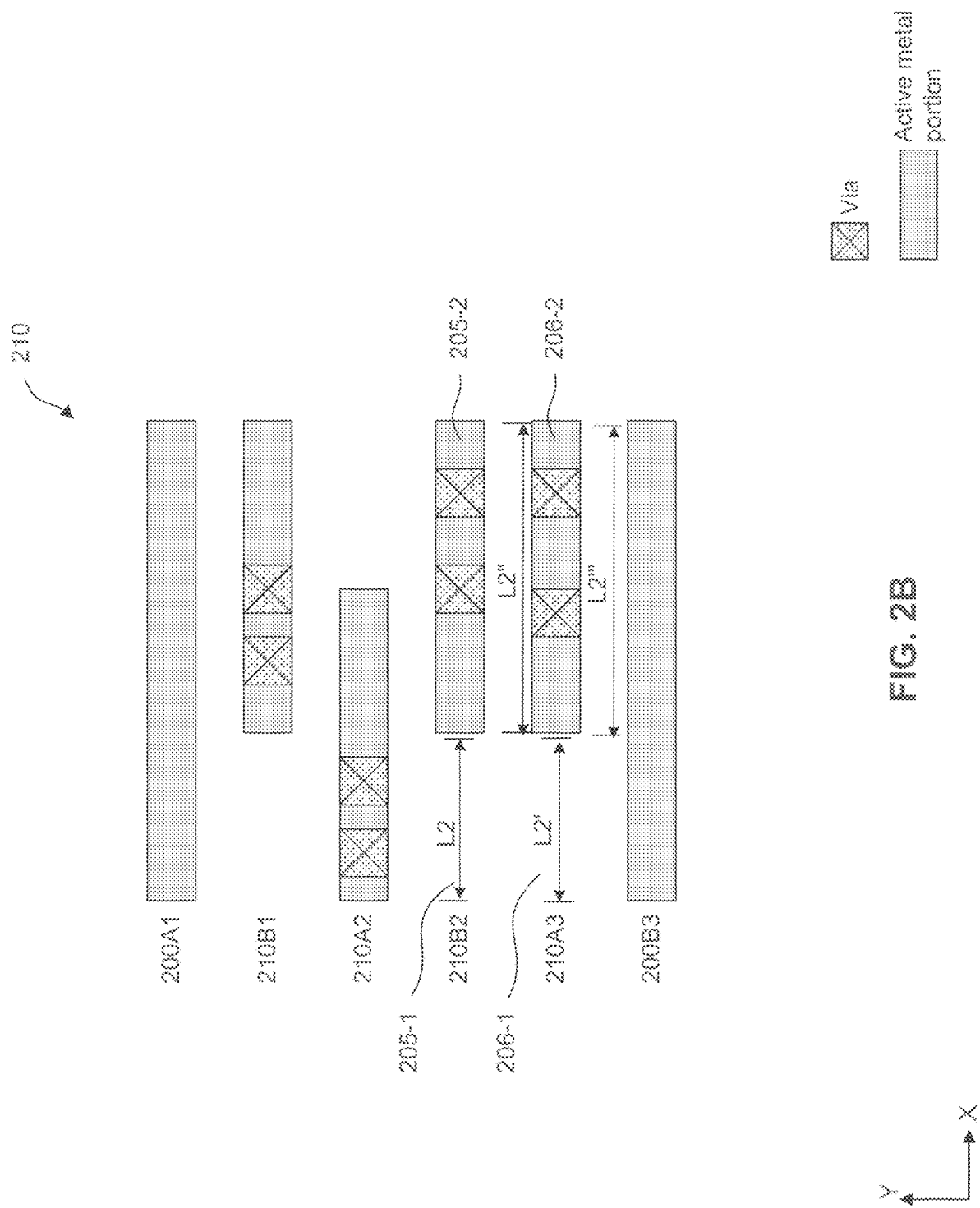
Figure 3:
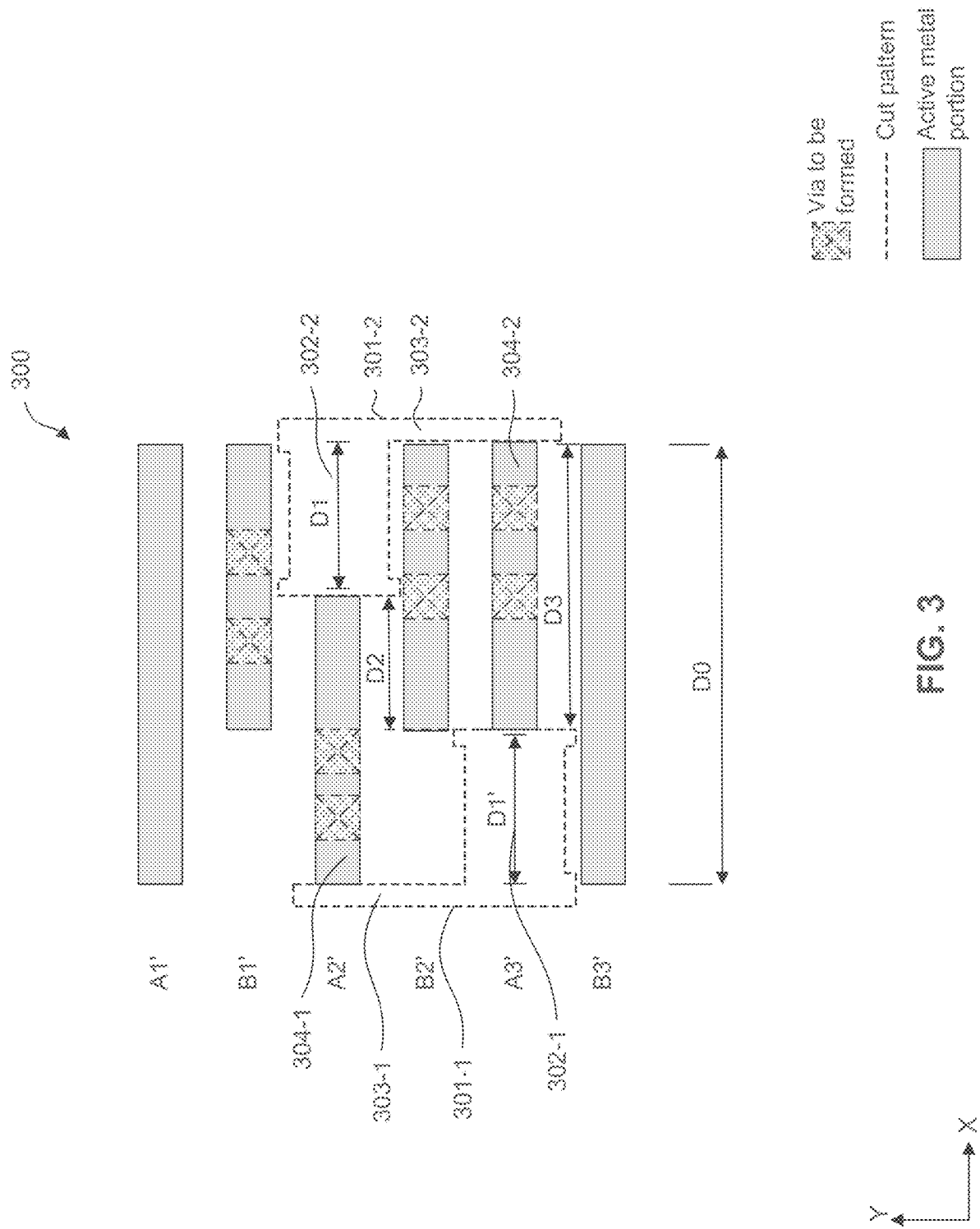
FIGS. 3-5 illustrate intermediate layouts to form the layout of FIG. 2B, in accordance with some embodiments.
Figure 4:
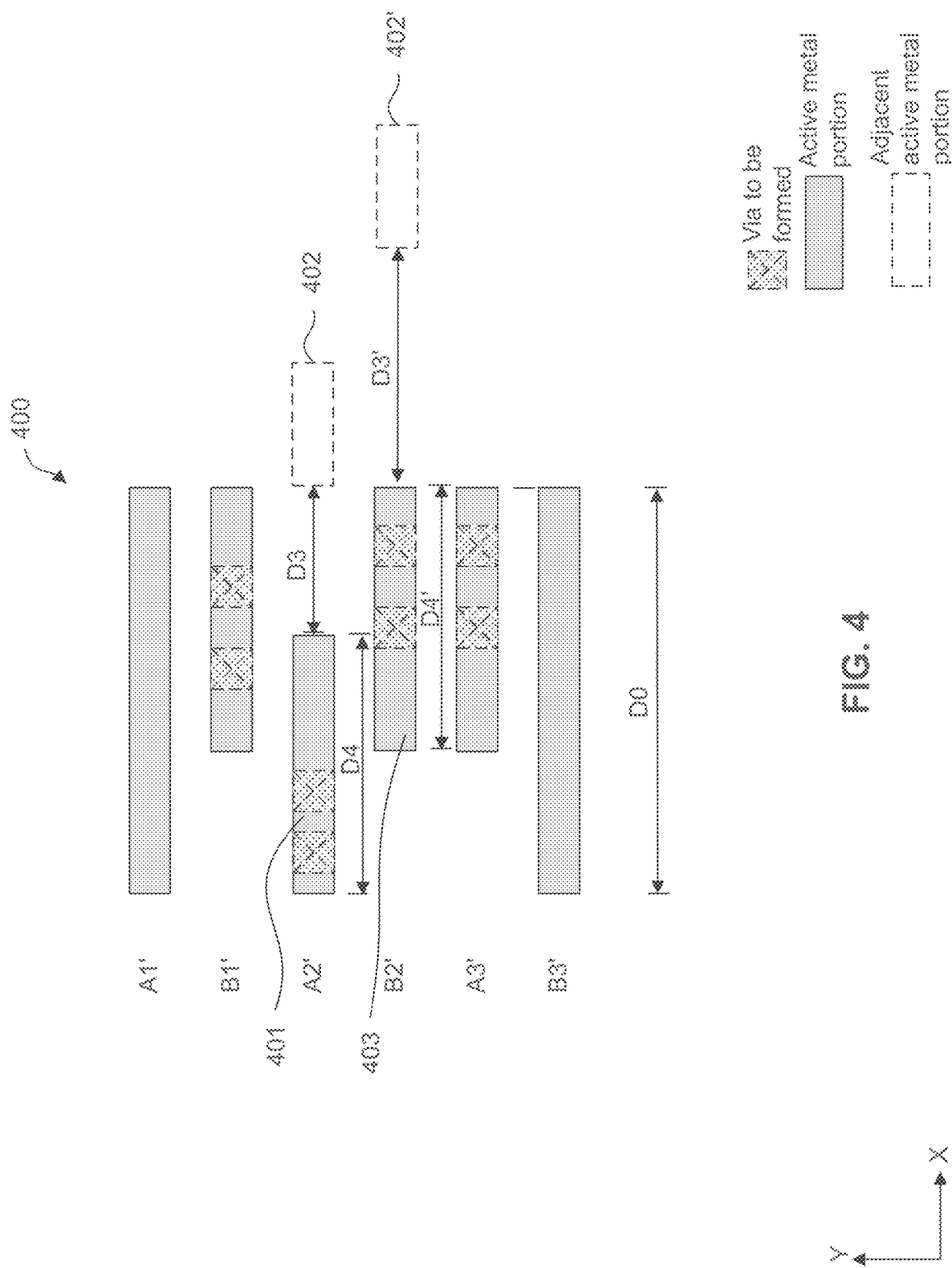
Figure 5:
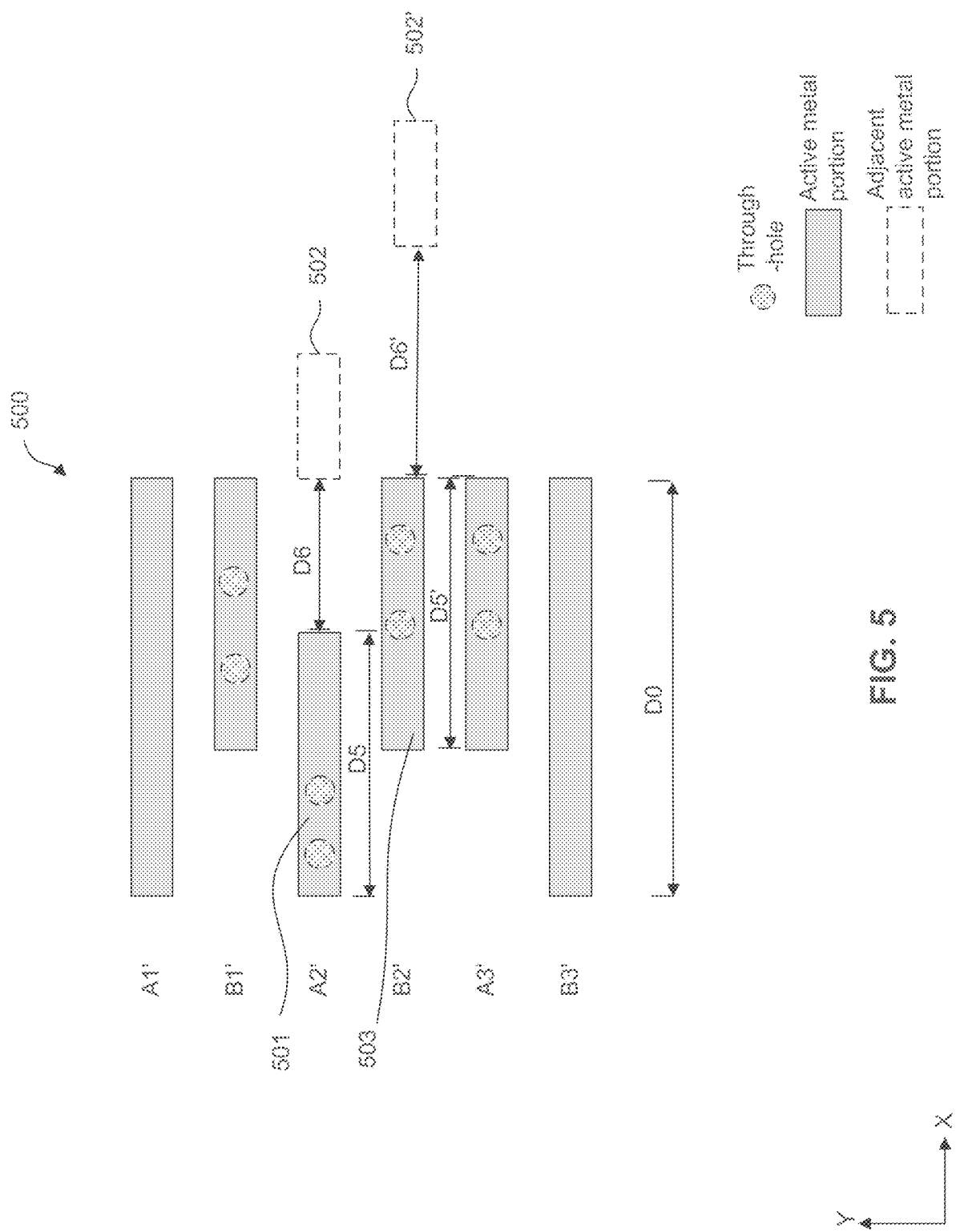

FIGS. 2A and 2B each illustrates a layout of metal interconnects with vias, according to some embodiments. FIGS. 3-5 each illustrates an intermediate circuit layout formed by a different circuit layout design process for forming the circuit layout in FIG. 2B, according to some embodiments. The layouts 200, 210, 300, 400, and 500 shown in respective FIGS. 2A-5 can be designed, e.g., in an electronic design automation (EDA) tool, and an IC fabrication process can be performed subsequently based on the layouts of FIGS. 2A and 2B to form the interconnect layers of the IC. Intermediate circuit layouts 300-500 shown in FIGS. 3-5 can be designed, e.g., in an EDA tool, and checked for design rule violations before the formation of circuit layout 210 of FIG. 2B. Layouts 200 and 210 and/or intermediate layouts 300-500 may need to comply with design rule check (DRC) to be taken to tape-out (e.g., the final result of design process for ICs before they are manufactured, specifically the point at which the graphic for the photomask of the ICs is sent to fabrication). In some embodiments, intermediate layouts 300-500 may have to comply with DRC. For example, the length of an active metal portion, the distance between two active metal portions, and/or the length of a removed and/or electrically disconnected redundant metal portion may have to comply with the lengths and/or distances defined in the design rules so that capacitance and/or resistance of the circuit can satisfy design and/or application requirements. In some embodiments, layout 210 can be formed from intermediate layouts 300-500. In some embodiments, the locations of the vias are determined when intermediate layouts 300-500 are being formed and/or designed. The locations of the vias can be determined before or after the removal and/or the electrical disconnection of redundant metal portions. In the present disclosure, the dimensions, shapes, and/or ratios of the patterns of metal interconnects in FIGS. 2A-2B, 3-7, 12A-16A, and 12B-16B are for illustrative purposes and do not indicate the dimensions, shapes, and/or ratios of the actual metal interconnects.

FIGS. 2A and 2B illustrate circuit layouts 200 and 210 of metal interconnects with redundant metal portions electrically disconnected and removed, respectively, according to some embodiments. Layouts 200 and 210 can be generated in an EDA tool, one or more photomasks can be formed based on layouts 200 and 210, and a subsequent IC fabrication process can be performed according to the photomasks to form the IC. In FIGS. 2A and 2B, metal interconnects 200A1-200A3, 200B1-200B3, 210A2-210A3, and 210B1-210B3 can be arranged alternatingly along a Y-axis. In some embodiments, metal interconnects 200A1-200A3, 200B1-200B3, 210A2-210A3, and 210B1-210B3 can be substantially parallel to one another along an X-axis. Vias can be formed after metal interconnects 200A2-200A3, 200B1-200B2, 210A2-210A3, and 210B1-210B2 can be formed to electrically connect components of different layers along a direction perpendicular to an X-Y plane. In an example subsequent IC fabrication process, metal interconnects 200A1-200A3 and 210A2-210A3 can be patterned through a first patterning process, and metal interconnects 200B1-200B3 and 210B1-210B2 can be patterned through a second patterning process, to form the IC corresponding to layouts 200 and 210. The dimensions (e.g., width and length) of a metal interconnect (any one of 200A1-200A3, 200B1-200B3, 210A2-210A3, and 210B1-210B3) and the number of metal interconnects can vary according to different applications and/or designs. For example, metal interconnects 200A1 and 200B3 can each have a vertical dimension (e.g., width) along a Y-axis larger than the vertical dimensions of metal interconnects 200A2-200A3 and/or 200B2-200B3, and can be fabricated subsequently to be the metal interconnects for electrically connecting to VDD (e.g., power supply) and GND (e.g., ground), respectively.

In circuit layout 200, as shown in FIG. 2A, each one of metal interconnects 200A2-200A3 and 200B1-200B2 can include a floating metal portion (shaded portion) and an active metal portion (solid grey portion). The floating metal portions can include the redundant metal portions of metal interconnects 200A2-200A3 and 200B1-200B2. The floating metal portions in each of metal interconnects 200A2-200A3 and 200B1-200B2 can be formed after electrically disconnecting and/or insulating redundant metal portions 105, as shown in FIG. 1A, from the active metal portions in the corresponding metal interconnects 200A2-200A3 and 200B1-200B2. The floating metal portion and the active metal portion of the same metal interconnect can be electrically insulated and/or disconnected from one another by inserting a metal cut in the circuit layout and/or an insulating portion (e.g., insulating portion 203-1, 203-2). The floating metal portions can be retained in the circuit layout and taken to tape-out.

The horizontal dimension L (e.g., length) of a floating metal portion of layout 200 along an X-axis can be sufficiently small, e.g., smaller than the smallest dimension allowed by existing design rules. In some embodiments, the horizontal dimension L can be constrained by the pitch of gates of the IC in which layout 200 with the floating metal portions can be formed in an interconnect layer over the gates. In some embodiments, the horizontal dimension L can be equal to about one gate pitch, which is the distance between centerlines of adjacent gates of the IC, where the centerlines can be along a Y-axis. The gate pitch can also be referred to as contacted poly pitch (CPP). So, one gate pitch can be referred to as 1 CPP. In layout 200 with small floating metal portions equal to about one gate pitch, vias on active metal portions adjacent to these small floating metal portions can be formed at a distance D (e.g., ranging from about 3 nm to about 5 nm) from the active metal portion ends (e.g., end E) facing these small floating metal portion, as shown in FIG. 2A.

In some embodiments, the design rules in an EDA tool can be modified to allow floating metal portions of desirably small lengths to exist in a circuit layout and the circuit layout (e.g., layout 200) to comply with DRC. In some embodiments, design rules that allow floating metal portions of desirably small lengths to be in a circuit layout can be added/supplemented into the existing design rules of an EDA tool that forms the circuit layout. In the subsequent IC fabrication process, the floating metal portions can be formed (e.g., through a deposition process) to form the actual IC. Because the floating metal portions are not electrically connected to other parts of the circuit, the quality of the metal film that forms the floating metal portions has little or no impact on the IC device performance. Thus, the floating metal portions can be deposited at the same time with the active metal portions. The deposition/formation of the active metal portions can be performed using a suitable metal interconnect fabrication process (shown in an example IC fabrication process with reference to FIGS. 11, 12A-16A, and 12B-16B).

As examples, metal interconnects 200B2 and 200A3 are described in detail. As shown in FIG. 2A, floating metal portion 201-1 of 200B2 can be electrically insulated and/or disconnected from active metal portion 201-2 by inserting insulating portion 203-1 and floating metal portion 202-1 of 200A3 can be electrically insulated and/or disconnected from active metal portion 202-2 by inserting insulating portion 203-2. The insulating portions 203-1 and 203-2 can be formed by a metal cut process during the subsequent IC fabrication process and can be referred to as metal cuts 203-1 and 203-2. In some embodiments, metal interconnects 200B2 and 200A3 can be insulated from each other by a spacer 204. In some embodiments, spacer 204 can be an insulating material such as, an oxide and/or a nitride material.

Length L1 of floating metal portion 201-1 and length L1' of floating metal portion 202-1 can each be shorter than, substantially equal to, or longer than the minimum length allowed by existing design rules. In some embodiments, lengths L1 and L1' are shorter than the minimum length allowed by existing design rules and floating metal portions 202-1 and 202-2 are retained. In some embodiments, lengths L1 and L1' can each be equal to or smaller than a suitable predetermined value defined by the existing design rules. For example the predetermined value can be in a range from about 0.5 CPP to about 2 CPP and/or from about 1 nm to about 50 μm. In some embodiments, the predetermined value is 1 CPP. In some embodiments, lengths L1 and L1' can be equal to or different from each other. In some embodiments, lengths L1 and L1' can be in a range from about 0.5 CPP to about 2 CPP and/or from about 1 nm to about 50 μm. In some embodiments, lengths L1 and/or L1' can be equal to about one gate pitch.

In some embodiments, width W of an insulating portion (e.g., metal cuts 203-1 and/or 203-2) can be a suitable value, depending on the resolution of the subsequent IC fabrication process. The widths W between the floating metal portions and the active metal portions of the same metal interconnect can be the same as or different from one another. In some embodiments, width W can be different for different metal interconnects. In some embodiments, width W can be less than 1 CPP. In some embodiments, width W can be in a range from about 0.5 CPP to about 2 CPP and/or from about 1 nm to about 50 μm.

In some embodiments, the floating metal portions of layout 200 can be deposited with the same electrically conductive material (e.g., a metal) that forms the active metal portions (e.g., 201-2 and 202-2) in a same metal deposition process. By designing/forming an insulating portion to electrically disconnect redundant metal portions 105 and form the floating metal portions and by allowing the floating metal portions of sufficiently small length to comply with design rules, more redundant metal portions can be electrically disconnected and/or removed from the active metal portions compared to the number of redundant metal portions removed using the methods described with reference to FIG. 1B. As a result, the capacitance of the IC can be reduced.

In a design process to form circuit layout 200, metal interconnects 200A1-200A3 and 200B1-200B3 without metal cuts (e.g., redundant metal portions 105 being connected with the corresponding active metal portions) can first be placed using an EDA tool. The locations and the lengths of the floating metal portions (e.g., 201-1 and 202-1) can then be determined (e.g., by the EDA tool). Redundant metal portions can then be electrically disconnected/cut from the corresponding active metal portions by insulating portions (e.g., metal cuts 203-1 and 203-2). In some embodiments, the floating metal portions are retained in the fabricated IC circuit.

In some embodiments, circuit layout 210 of FIG. 2B can be designed based on circuit layout 200. In circuit layout 210, as shown in FIG. 2B, redundant metal portions 105 can be removed from metal interconnects 210B1, 210B2, 210A2, and 210A3, according to some embodiments. The length of a removed redundant metal portion along its extending direction (e.g., an X-axis) can be less than or equal to a desired value. The value of the length of the removed redundant metal portion can be sufficiently small to allow the remaining corresponding active metal portion to have a sufficient length. In some embodiments, the length of the removed redundant metal portion can be less than or equal to 1 CPP. The removal of redundant metal portion of such length can effectively reduce the parasitic capacitance of the IC. In some embodiments, the length of the removed redundant metal portion can be in a range from about 0.5 CPP to about 2 CPP and/or from about 1 nm to about 50 μm. In some embodiments, the length of the removed redundant metal portions of one metal interconnect can be equal to or different from the removed redundant metal portions of other metal interconnects. In some embodiments, the length of the active metal portion can be in a range from about 0.5 CPP to about 2 CPP and/or from about 1 nm to about 50 μm. In some embodiments, the length of the active metal portion can be at least 2 CPP. The active metal portions can allow subsequent metal interconnects that are patterned by self-alignment based on these active metal portions to align properly in the subsequent IC fabrication process. In some embodiments, the floating metal portions shown in FIG. 2A can have the same locations as the removed redundant metal portions shown in FIG. 2B.

For example, in some embodiments, the lengths (e.g., L2 and L2') of removed redundant portions (e.g., 205-1 and 206-1) of metal interconnects 210B2 and 210A3 can each be equal to or less than about 1 CPP. In some embodiments, the lengths (e.g., L2" and L2') of the corresponding remaining active metal portions (e.g., 205-2 and 206-2) can be longer than or equal to about 1 CPP. In the IC fabrication process, metal interconnects 210A1-210A3 can be patterned first, followed by patterning of metal interconnects 210B1-210B3 using self-alignment based on metal interconnects 210A1-210A3. Lengths (e.g., L2') of active metal portions (e.g., 206-2) of metal interconnects 210A1-210A3 can be sufficiently long to allow metal interconnects 210B1-210B3 to self-align based on the active metal portions of metal interconnects 210A1-210A3.

FIGS. 3-5 illustrate intermediate circuit layouts 300-500 to form circuit layout 210 in FIG. 2B, using different methods of removing redundant metal portions 105, according to some embodiments. In intermediate circuit layouts 300-500, A1'-A3' and B1'-B3' represent metal interconnects before circuit layout 210 is formed. Different from circuit layout 200 in FIG. 2A, no floating metal portions are formed using methods illustrated by intermediate circuit layouts 300-500. Metal cuts can be replaced by removal of redundant metal portions 105 in 300-500. In the subsequent IC fabrication process, the parts of interconnect layers of IC where the redundant metal portions are to be removed can be patterned and then filled with dielectric materials, such as one or more of silicon oxide ($SiO_x$), silicon nitride ($SiN_x$), silicon carbide oxynitride ($SiC_xO_xN_x$), high-k materials, metal oxide, and/or other suitable dielectric materials. In contrast, the parts of interconnect layers of IC where the redundant metal portions are to be disconnected, as discussed above for layout 200, can be patterned and then filled with conductive materials, which can be similar to the conductive materials of the active metal portions of metal interconnects. The active metal portions of the metal interconnects of the present disclosure can include conductive materials, such as titanium (Ti), tantalum (Ta), nickel (Ni), tungsten (W), cobalt (Co), copper (Cu), and/or other suitable materials.

Referring back to FIG. 3, circuit layout 210 can be formed by removing redundant metal portions of a desired length from metal interconnects for self-alignment, and placing the active metal portions of the rest of the metal interconnects in intermediate circuit layout 300. No floating metal portions are placed in intermediate circuit layout 300. For example, the length of a removed redundant metal portion in a metal interconnect for self-alignment can be sufficiently small (e.g., in a range from about 0.5 CPP to about 2 CPP and/or from about 1 nm to about 50 μm. so that the remaining corresponding active metal portion has sufficiently long length (e.g., in a range from about 0.5 CPP to about 2 CPP and/or from about 1 nm to about 50 μm. In some embodiments, the length of the active metal portion is at least 2 CPP. The remaining active metal portion can be used for the formation of the metal interconnects in the subsequent IC fabrication process by self-alignment process. The lengths of the metal interconnects formed in the self-alignment process can be of any suitable values. For example, the lengths of the self-aligned metal interconnects can be minimized to further reduce parasitic capacitance of the IC.

For example, intermediate circuit layout 300 can include first set of metal interconnects A1'-A3' and second set of metal interconnects B1'-B3'. Metal interconnects A1'-A3' can be patterned first, followed by the patterning of metal interconnects B1'-B3' in a self-alignment process based on the patterns of metal interconnects A1'-A3'. In some embodiments, metal interconnects A1'-A3' each has a length of D0 along an X-axis prior to the removal of redundant metal portions 105 (as shown in FIG. 1A). It can then be determined (e.g., by the EDA tool) the locations of the vias to be formed in and the locations of the redundant metal portions to be removed from metal interconnects A1'-A3'. Further, metal cut patterns (e.g., 301-1 and 301-2) can be used (e.g., by the EDA tool) to remove the first redundant metal portions 105 of A1'-A3', and retain the first active metal portions of metal interconnects A1'-A3'. In some embodiments, a metal cut pattern (e.g., 301-1 or 301-2) can include a horizontal portion (e.g., 302-1 or 302-2) along an X-axis and a vertical portion (e.g., 303-1 or 303-2) along a Y-axis. In some embodiments, the horizontal portions limit the horizontal lengths (e.g., along an X-axis) of the removed first redundant metal portions 105 from metal interconnects A1'-A3' and the vertical portions limit the lengths and/or boundaries of neighboring features (e.g., neighboring active metal portions). In some embodiments, the length (e.g., D1 or D1') of a horizontal portion is substantially equal to or greater than the length of a removed first redundant metal portions 105 from metal interconnects A1'-A3'. In some embodiments, the length of the removed first redundant metal portions 105 from metal interconnects A1'-A3' is about 1 CPP. In some embodiments, the length of horizontal portion is greater than or equal to about 1 CPP, and the width of a horizontal portion along a Y-axis sufficiently covers the width of a redundant metal portion along a Y-axis. In some embodiments, the horizontal distance (e.g., D2) along an X-axis between two adjacent (e.g., closest) metal cut patterns is at least about 1 CPP. In some embodiments, the length (e.g., D3) of a first active metal portion (e.g., 304-1 or 304-2) is at least about 2 CPP. The metal cut pattern can include any suitable shapes that can cover the redundant metal portions to be removed and define the lengths of active metal portions along an X-axis. In some embodiments, a metal cut pattern (e.g., 301-1 or 301-2) can have an axe-like shape.

Further, referring to FIG. 3, the second active metal portions of metal interconnects B1'-B3' can be determined and patterned based on the pattern of the first active metal portions of metal interconnects A1'-A3' along an X-axis. For example, metal interconnects B1'-B3' can be parallel to metal interconnects A1'-A3' and can have minimized and/or optimized lengths with respect to the removed redundant metal portions from metal interconnects A1'-A3'. The first active metal portions of A1'-A3' can be sufficiently long so that no contact and/or intersection can be formed between metal interconnects A1'-A3' and B1'-B3'. Thus, no short circuit can be formed in the subsequently formed IC. By limiting the lengths of redundant metal portions in the metal interconnects for self-alignment at the design stage, the lengths of the corresponding remaining active metal portions formed by the self-alignment process can be maximized, and the self-alignment process can be performed efficiently. Meanwhile, maximized number of redundant metal portions in metal interconnects can be removed and no additional patterning step is needed to disconnect or cut the redundant metal portions from metal interconnects (e.g., B1'-B3') formed in the subsequent IC fabrication process. As a result, the formation of the IC can be simplified and the reduction of parasitic capacitance can be maximized. Further, yield of the IC can be improved and the uniformity of CD of the IC can be improved.

FIG. 4 illustrates another intermediate circuit layout 400 to form circuit layout 210 in FIG. 2B. Different from intermediate circuit layout 300 shown in FIG. 3, in intermediate circuit layout 400, the active metal portions of metal interconnects used in the self-alignment process of forming metal interconnects can be directly placed within the metal interconnect layout, and metal cuts are represented by end-to-end distance between two ends of metal interconnects. No floating metal portions are placed within the metal interconnect layout. The active metal portions for the self-alignment process can have desired lengths (e.g., in a range from about 0.5 CPP to about 2 CPP and/or from about 1 nm to about 50 μm. to allow the self-alignment process to be performed efficiently. In some embodiments, the length (e.g., D4 and D4') of an active metal portion (e.g., 401 and 402) along an X-axis is at least about 2 CPP. In some embodiments, the horizontal distance (e.g., D3) between two adjacent ends of metal interconnects (e.g., 401 and 402) along an X-axis is greater than or equal to about CPP. In some embodiments, this horizontal distance is less than about 2 CPP. Method illustrated in FIG. 4 is also referred to as a "natural end" method.

For example, referring to FIG. 4, intermediate circuit layout 400 can include first set of metal interconnects A1'-A3' and second set of metal interconnects B1'-B3'. Metal interconnects A1'-A3' can be patterned first, followed by the patterning of metal interconnects B1'-B3' in a self-alignment process based on the patterns of metal interconnects A1'-A3'. Elements 402 and 402' (in dashed lines) represent ends of metal interconnects adjacent to active metal portions 401 and 403, respectively. The first set of metal interconnects can include active metal portions (e.g., 401) for self-alignment purposes in the subsequent IC fabrication process of metal interconnects (e.g., second set of metal interconnects B1'-B3'). The active metal portions of the first set of metal interconnects A1'-A3' are sufficiently long to allow the second set of metal interconnects to self-align based on the pattern of metal interconnects A1'-A3'. In some embodiments, the length (e.g., D4) of an active metal portion (e.g., 401) of the first set of metal interconnects A1'-A3' is at least about 2 CPP. In some embodiments, the end-to-end distance (e.g., D3) between two adjacent ends of metal interconnects (e.g., 401 and 402) for subsequent self-alignment purposes is greater than or equal to about 1 CPP. The lengths (e.g., D4') of the second active metal portions of the second set of metal interconnects B1'-B3' can be of any suitable value along an X-axis. In some embodiments, the second set of metal interconnects include second active metal portions with minimized lengths, e.g., with the second redundant metal portions minimized and/or optimized, to further reduce parasitic capacitance of the IC. In some embodiments, the horizontal distance (e.g., D3') between two adjacent ends of metal interconnects (e.g., 403 and 402) that may not be for self-alignment purposes (e.g., the second set of metal interconnects) can be of any suitable value (e.g., greater than, equal to, or less than 1 CPP) along an X-axis.

FIG. 5 illustrates another intermediate circuit layout 500 to form circuit layout 210 in FIG. 2B. Different from intermediate circuit layout 400 shown in FIG. 4, in intermediate circuit layout 500, the metal interconnects can include active metal portions that are placed based on the locations of the vias. No floating metal portions are placed with the circuit layout. In the design process, the active metal portions of the metal interconnects for the subsequent self-alignment purposes can be placed by expanding the active metal portions (e.g., along an X-axis) based on the location(s) of the via(s). Active metal portions placed based on vias sufficiently far away from one another can be electrically disconnected and/or cut by a distance, which is equivalent or comparable to removing a redundant metal portion. Active metal portions placed based on vias sufficiently close to one another are merged together. The active metal portions can expand bi-directionally along an X-axis from the location(s) of the via(s) until they have sufficient lengths to allow the self-alignment to be performed properly.

For example, referring to FIG. 5, intermediate circuit layout 500 can include first set of metal interconnects A1'-A3' and second set of metal interconnects B1'-B3'. Metal interconnects A1'-A3' can be patterned first, followed by the patterning of metal interconnects B1'-B3' in a self-alignment process based on the patterns of metal interconnects A1'-A3'. Vias are to be formed from the through-holes shown in FIG. 5, and the locations of vias are represented by the locations of the through-holes. In a design process, the length of a first active metal portion (e.g., 501) can be determined by expanding first active metal portion 501 bi-directionally along an X-axis until first active metal portion 501 has sufficient length for subsequent self-alignment process in the fabrication process. Elements 502 and 502' (in dashed lines) represent metal interconnects formed based on other through-holes away from the through-holes of first active metal portions. In some embodiments, the length (e.g., D5) of a first active metal portion (e.g., 501) for self-alignment purposes is at least about 2 CPP. In some embodiments, the length D5 can be in a range from about 0.5 CPP to about 2 CPP and/or from about 1 nm to about 50 μm.

In some embodiments, the horizontal distance (e.g., D6) between two adjacent ends of metal interconnects is greater than or equal to about 1 CPP. In some embodiments, the length D6 can be in a range from about 5 CPP to about 2 CPP and/or from about 1 nm to about 50 μm. In some embodiments, the length (e.g., D5') of a second active metal portion (e.g., 503) is can be any suitable value along an X-axis. In some embodiments, the length D5' can be in a range from about 0.5 CPP to about 2 CPP and/or from about 1 nm to about 50 μm. In some embodiments, the end-to-end distance (e.g., D6') between two adjacent ends of metal interconnects (e.g., 503 and 502') that are not for self-alignment purposes (e.g., the second set of metal interconnects) can be of any suitable value (e.g., greater than, equal to, or less than CPP) along an X-axis. In some embodiments, the length D6' can be in a range from about 0.5 CPP to about 2 CPP and/or from about 1 nm to about 50 μm.

In some embodiments, the lengths of active metal portions of different sets of metal interconnects can be formed independently based on the locations of the corresponding vias. For example, the active metal portions can be formed by expanding bi-directionally along an X-axis based on the locations of the respective vias. In the subsequent IC fabrication process, metal interconnects of different sets can be patterned independently and no self-alignment is needed. The lengths of active metal portions can be less confined. For example, the lengths of active metal portions can be minimized to further reduce redundant metal portions/parasitic capacitance of the IC. In some embodiments, the length (e.g., D5) of a first active metal portion (e.g., 501) is at least about 2 CPP. In some embodiments, the length (e.g., D5') of a second active metal portion (e.g., 503) is at least about 2 CPP.

Figure 6:
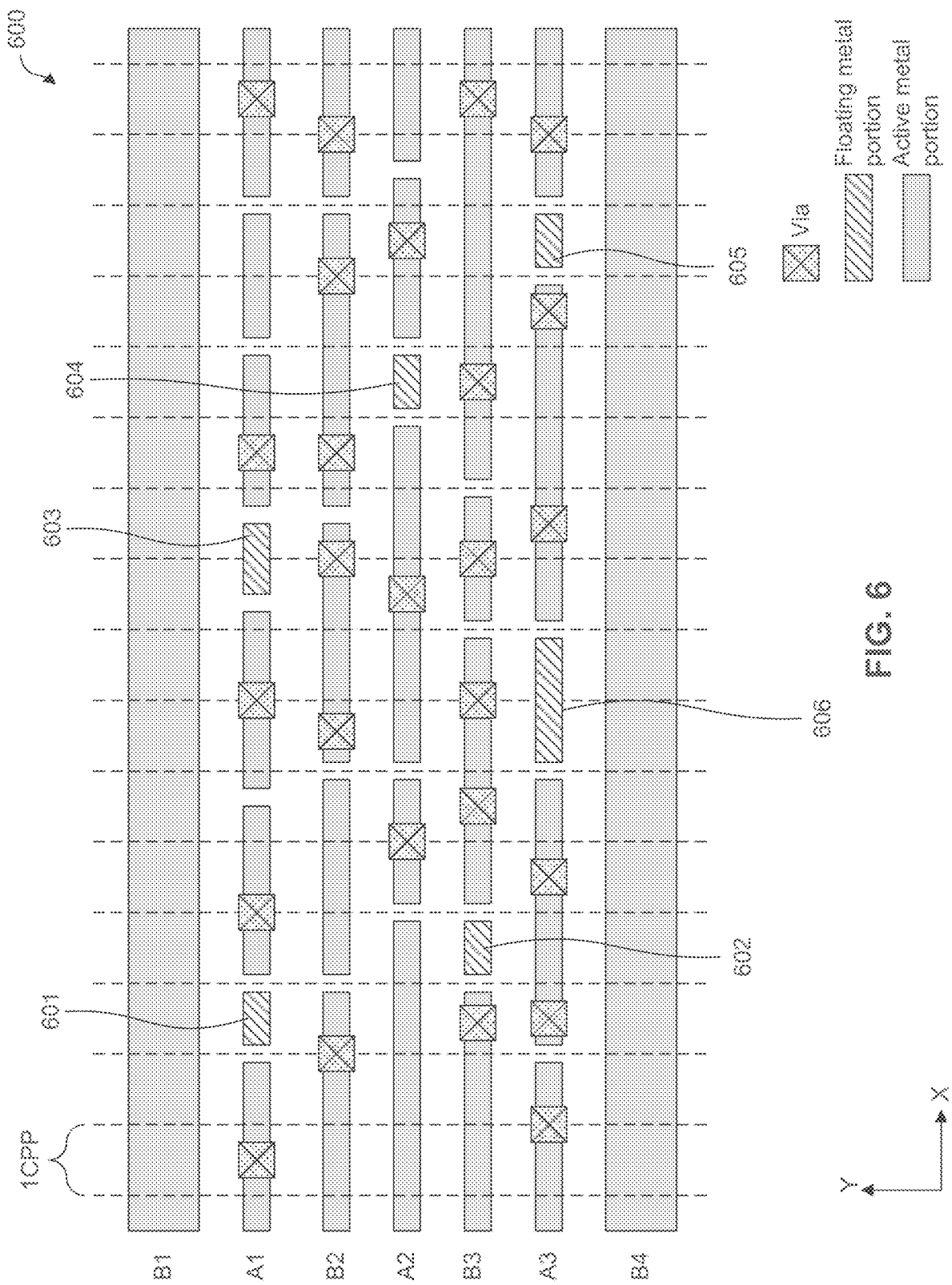
FIGS. 6-7 illustrate a layout view of metal interconnects in an IC, in accordance with some embodiments.
Figure 7:
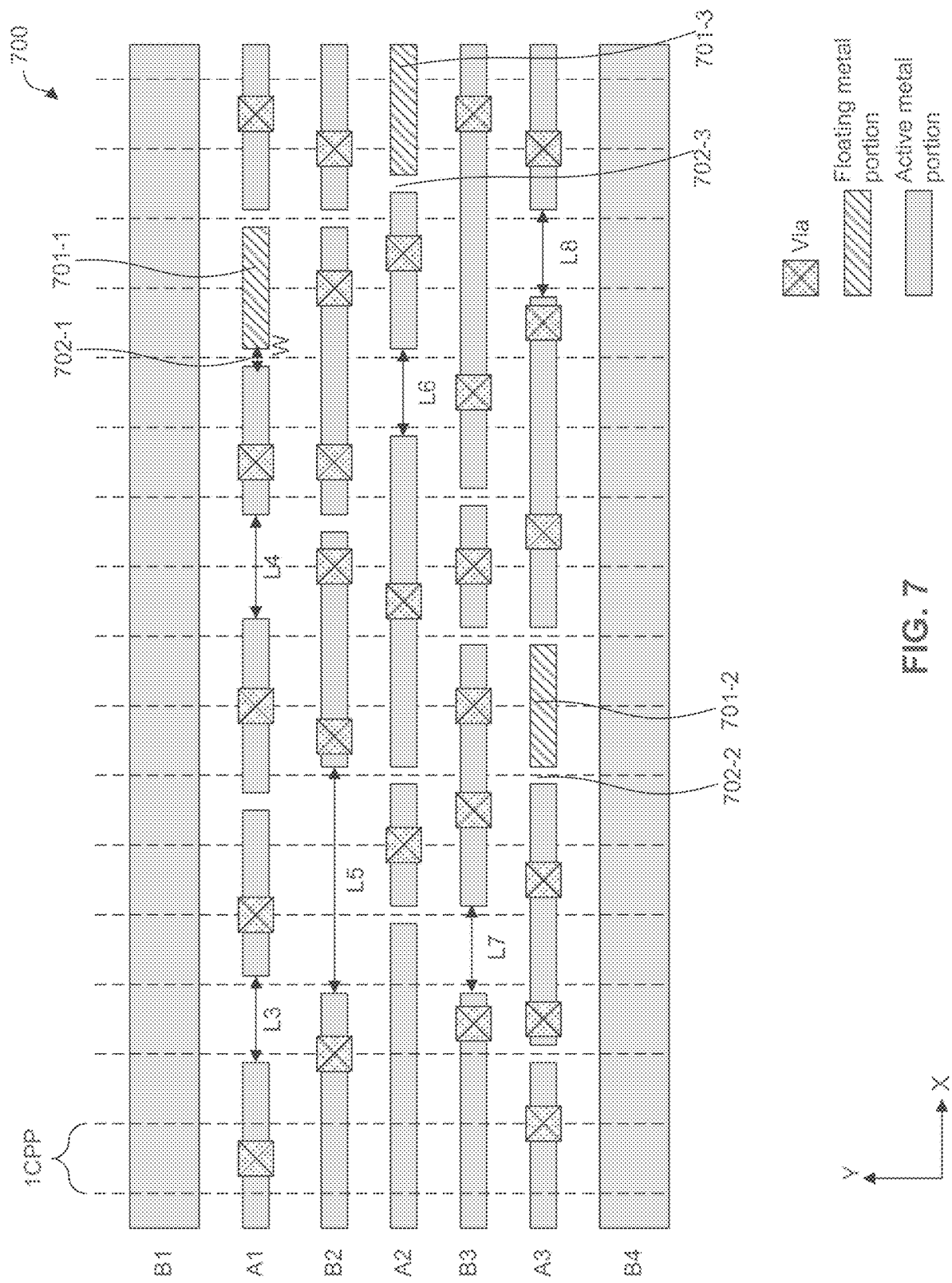

FIGS. 6 and 7 illustrate circuit layouts 600 and 700, according to some embodiments. In FIGS. 6 and 7, metal interconnects A1-A3 can be used for the subsequent self-alignment process and metal interconnects B1-B4 are for forming metal interconnects by self-alignment based on the pattern of metal interconnects A1-A3. Floating metal portions can be formed in circuit layout 600 by metal cuts as discussed above with reference to FIG. 2A. In FIG. 6, floating metal portions 601-605 formed in metal interconnects A1-A3 and B3 can each have a horizontal length (e.g., along an X-axis) of less than or equal to 1 CPP. In FIG. 7, the end-to-end distances (e.g., L3, L4, L6, and L8) between two adjacent ends of metal interconnects in A1-A3 can be greater than 1 CPP and less than 2 CPP. The end-to-end distances (e.g., L5 and L7) between two adjacent ends of metal interconnects in B2 and B3 can be of any desired value, e.g., greater than 1 CPP.

In some embodiments, floating metal portions 701-1, 701-2, and 701-3 are formed by metal cuts (e.g., 702-1, 702-2, and 702-3). The lengths of these floating metal portions can be greater than 1 CPP. Because the width W of a metal cut is less than CPP, in some embodiments, the floating metal portions are retained in circuit layout 700. In some embodiments, floating metal portions with lengths greater than, equal to, and smaller than 1 CPP can be formed in a same IC to electrically disconnect redundant metal portions. In some embodiments, removal of redundant metal portions with dielectric materials can also be formed in the same IC with the floating metal portions.

By using the methods of the present disclosure, redundant metal portions with small lengths in an IC can be electrically disconnected by metal cuts to form floating metal portions or can be replaced by dielectric materials. The multi-patterning process used in the subsequent IC fabrication process would not be affected. The reduction of redundant metal portions can be maximized and the arrangement of metal interconnects can be optimized by using the methods of the present disclosure. Further, the electrical disconnection and/or reduction of redundant metal portions would thus have little or no adverse impact on the subsequent IC fabrication process. The resultant IC can thus have uniform CD and reduced parasitic capacitance, and consequently, the speed of the IC can be improved.

Figure 8:
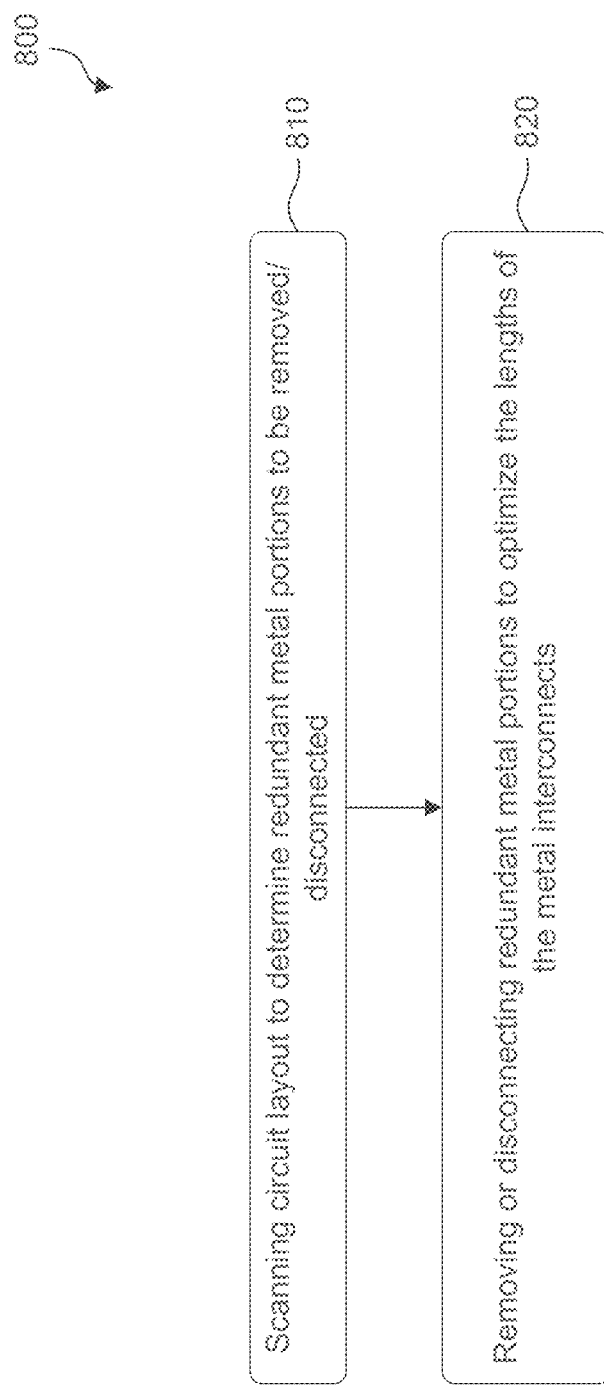
FIG. 8 is a flow diagram of a method for forming a layout of metal interconnects in an IC, in accordance with some embodiments.

FIG. 8 is a flow diagram of a method 800 for removing and/or electrically disconnecting redundant metal portions in a circuit layout, according to some embodiments. In some embodiments, operations of method 800 can be performed in different orders. Variations of method 800 should also be within the scope of the present disclosure.

In operation 810, a circuit layout is scanned to determine redundant metal portions that need to be removed and/or electrically disconnected. These determined redundant portions can be placed in metal interconnects in a layout area. In some embodiments, it can be determined (e.g., by the EDA tool) that the metal portions not connected with vias are redundant metal portions (e.g., redundant metal portions 105). The locations of the redundant metal portions can be those described with reference to FIGS. 2A-2B and 3-7.

In operation 820, redundant metal portions are electrically disconnected and/or removed to optimize the lengths of the metal interconnects. In some embodiments, the disconnection of redundant metal portions can include the placement/formation of floating metal portions, for example, as described with reference to FIG. 2A. In some embodiments, the removal of redundant metal portions can include one or more processes, for example, as described with reference to FIGS. 2B and 3-7. Active metal portions can be retained in the metal interconnects of the circuit layout. In some embodiments, the removal of redundant portions can include replacement of the redundant metal portions with dielectric materials. The arrangement of the resulting metal interconnects can be in accordance with DRC rules. In some embodiments, before redundant metal portions can be removed and/or electrically disconnected, it is determined whether it is possible to remove and/or electrically disconnect the redundant metal portions without violating the spacing rules and/or DRC rules. In some embodiments, DRC rules can include the spacing rules of the metal cut optimization structure described above.

Figure 9:
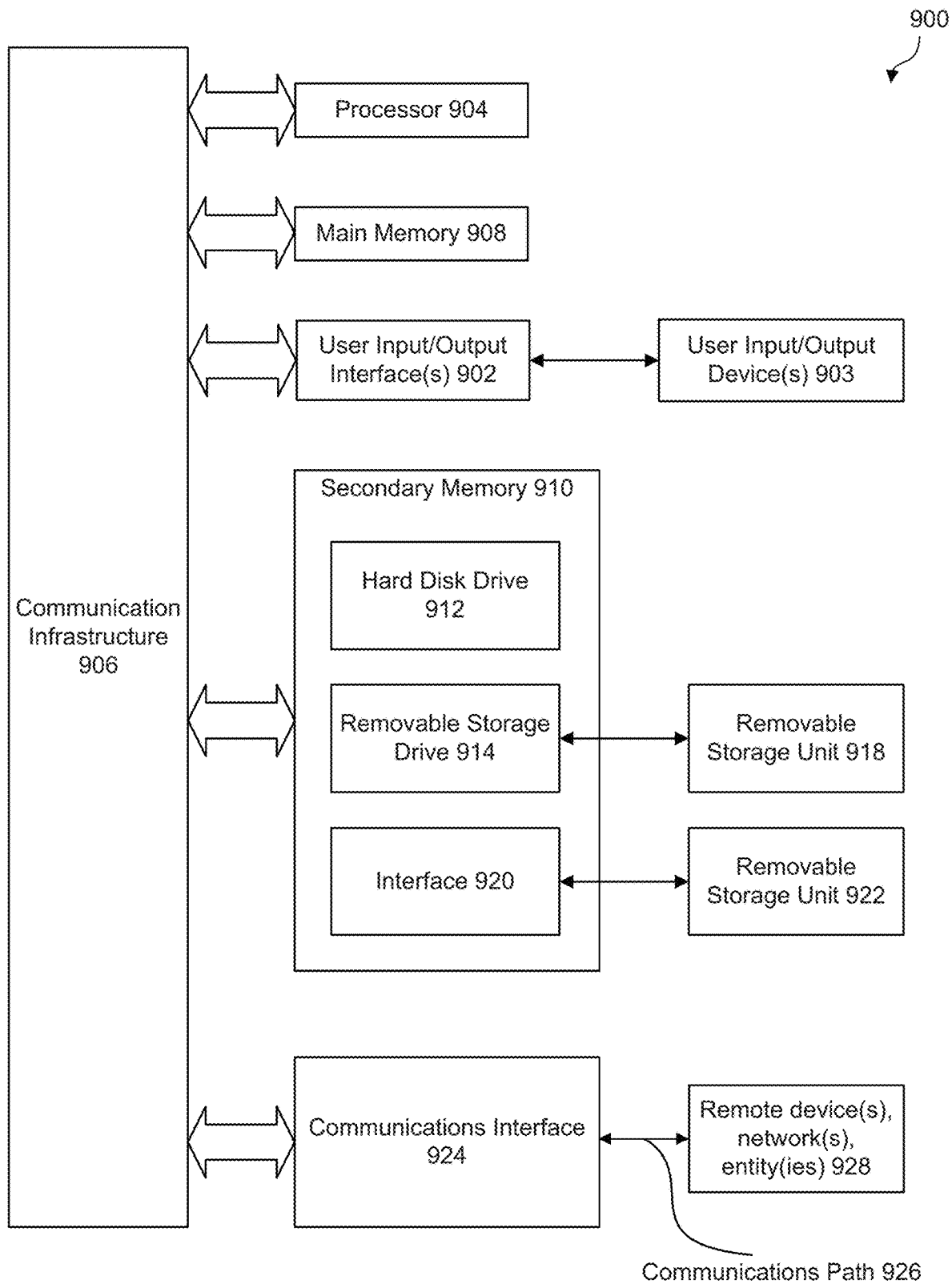
FIG. 9 illustrates an example computer system for implementing various embodiments of the present disclosure, in accordance with some embodiments.

FIG. 9 is an illustration of an example computer system 900 in which various embodiments of the present disclosure can be implemented, according to some embodiments. Computer system 900 can be any well-known computer capable of performing the functions and operations described herein. For example, and without limitation, computer system 900 can be capable of determining redundant metal portions and metal interconnects to be optimized and placing metal cuts/dielectric materials at desired locations in the circuit layout, for example, an EDA tool. Computer system 900 can be used, for example, to execute one or more operations in method 800 and/or method 1000, which describes an example method for placing metal cuts/dielectric materials for disconnecting/reducing redundant metal portions in a layout area.

Computer system 900 includes one or more processors (also called central processing units, or CPUs), such as a processor 904. Processor 904 is connected to a communication infrastructure or bus 906. Computer system 900 also includes input/output device(s) 903, such as monitors, keyboards, pointing devices, etc., that communicate with communication infrastructure or bus 906 through input/output interface(s) 902. An EDA tool can receive instructions to implement functions and operations described herein—e.g., method 800 of FIG. 8 and/or method 1000 of FIG. 10—via input/output device(s) 903. Computer system 900 also includes a main or primary memory 908, such as random access memory (RAM). Main memory 908 can include one or more levels of cache. Main memory 908 has stored therein control logic (e.g., computer software) and/or data. In some embodiments, the control logic (e.g., computer software) and/or data can include one or more of the operations described above with respect to method 800 of FIG. 8 and/or method 1000 of FIG. 10.

Computer system 900 can also include one or more secondary storage devices or memory 910. Secondary memory 910 can include, for example, a hard disk drive 912 and/or a removable storage device or drive 914. Removable storage drive 914 can be a floppy disk drive, a magnetic tape drive, a compact disk drive, an optical storage device, tape backup device, and/or any other storage device/drive.

Removable storage drive 914 can interact with a removable storage unit 918. Removable storage unit 918 includes a computer usable or readable storage device having stored thereon computer software (control logic) and/or data. Removable storage unit 918 can be a floppy disk, magnetic tape, compact disk, DVD, optical storage disk, and/any other computer data storage device. Removable storage drive 914 reads from and/or writes to removable storage unit 918 in a well-known manner.

According to some embodiments, secondary memory 910 can include other means, instrumentalities or other approaches for allowing computer programs and/or other instructions and/or data to be accessed by computer system 900. Such means, instrumentalities or other approaches can include, for example, a removable storage unit 922 and an interface 920. Examples of the removable storage unit 922 and the interface 920 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 910, removable storage unit 918, and/or removable storage unit 922 can include one or more of the operations described above with respect to method 800 of FIG. 8 and/or method 1000 of FIG. 10.

Computer system 900 can further include a communication or network interface 924. Communication interface 924 enables computer system 900 to communicate and interact with any combination of remote devices, remote networks, remote entities, etc. (individually and collectively referenced by reference number 928). For example, communication interface 924 can allow computer system 900 to communicate with remote devices 928 over communications path 926, which can be wired and/or wireless, and which can include any combination of LANs, WANs, the Internet, etc. Control logic and/or data can be transmitted to and from computer system 900 via communication path 926.

The operations in the preceding embodiments can be implemented in a wide variety of configurations and architectures. Therefore, some or all of the operations in the preceding embodiments—e.g., method 800 of FIG. 8 and method 1000 of FIG. 10 (described below)—can be performed in hardware, in software or both. In some embodiments, a tangible apparatus or article of manufacture comprising a tangible computer useable or readable medium having control logic (software) stored thereon is also referred to herein as a computer program product or program storage device. This includes, but is not limited to, computer system 900, main memory 908, secondary memory 910 and removable storage units 918 and 922, as well as tangible articles of manufacture embodying any combination of the foregoing. Such control logic, when executed by one or more data processing devices (such as computer system 900), causes such data processing devices to operate as described herein. In some embodiments, computer system 900 is installed with software to perform operations in the manufacturing of photomasks and circuits, as illustrated in method 1000 of FIG. 10 (described below). In some embodiments, computer system 900 includes hardware/equipment for the manufacturing of photomasks and circuit fabrication. For example, the hardware/equipment can be connected to or be part of element 928 (remote device(s), network(s), entity(ies) 928) of computer system 900.

Figure 10:
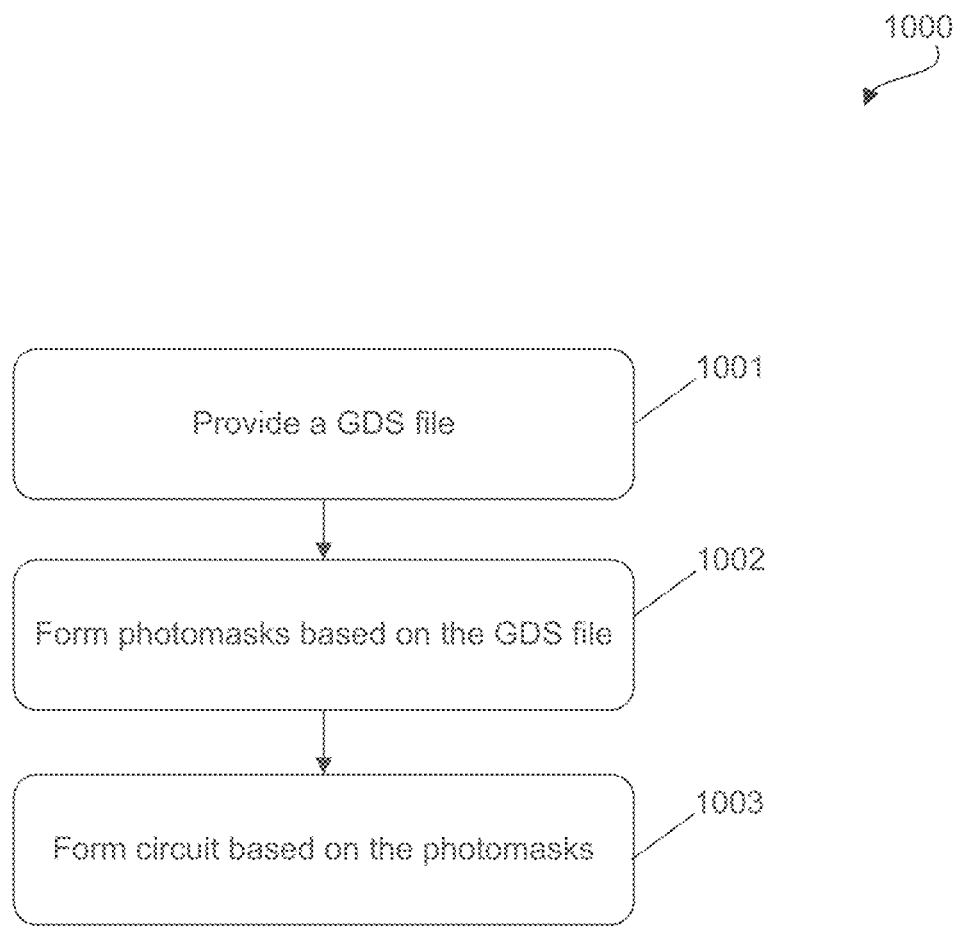
FIG. 10 is a flow diagram of a method for forming a layout of metal interconnects in an IC based on a graphic database system (GDS) file, in accordance with some embodiments.
Figure 12A:
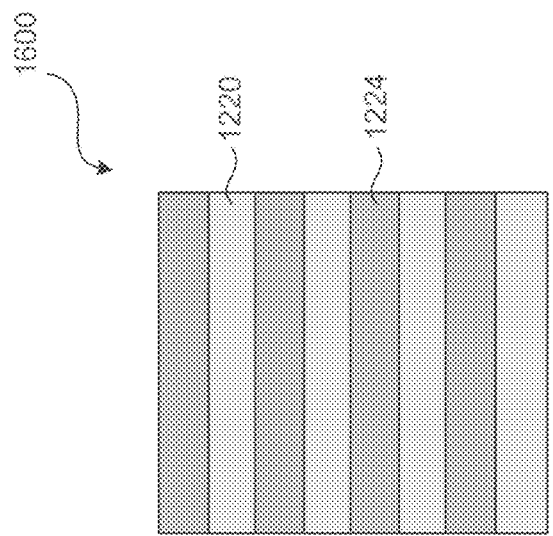
Figure 12B:
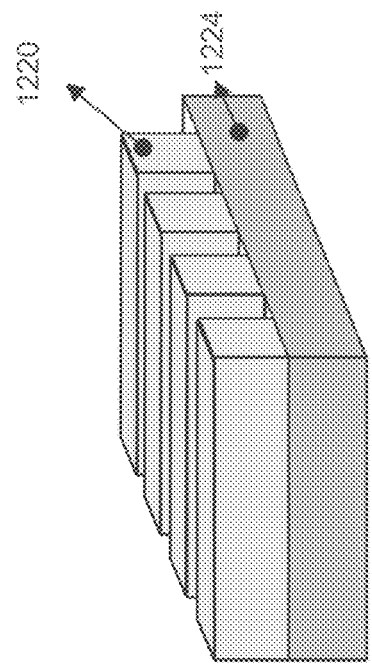

FIG. 10 is a flow diagram of a method 1000 for circuit fabrication, according to some embodiments. In some embodiments, method 1000 may be used to form circuit having circuit layout such as layout 200, 210, 300, 400, 500, 600, and/or 700. In some embodiments, operations/steps of method 1000 can be performed in a different order. Variations of method 1000 should also be within the scope of the present disclosure.

In operation 1001, a GDS file is provided. The GDS file can be generated by an EDA tool and include metal interconnects optimized based on the present disclosure. The operation depicted in 1001 can be performed by, for example, an EDA tool that operates on a computer system, such as computer system 900 described above.

In operation 1002, photomasks are formed based on the GDS file. In some embodiments, the GDS file provided in operation 1001 is taken to a tape-out operation to generate photomasks for fabricating one or more integrated circuits. In some embodiments, a circuit layout included in the GDS file can be read and transferred onto a quartz or glass substrate to form opaque patterns that correspond to the circuit layout. The opaque patterns can be made of, for example, chromium or other suitable metals. Operation 1002 can be performed by a photomask manufacturer, where the circuit layout is read using a suitable software tool (e.g., an EDA tool) and the circuit layout is transferred onto a substrate using a suitable printing/deposition tool. The photomasks reflect the circuit layout/features included in the GDS file.

In operation 1003, one or more circuits are formed based on the photomasks generated in operation 1002. In some embodiments, the photomasks are used to form patterns/structures of the circuit contained in the GDS file. In some embodiments, various fabrication tools (e.g., photolithography equipment, deposition equipment, and etching equipment) are used to form features of the one or more circuits.

Figure 11:
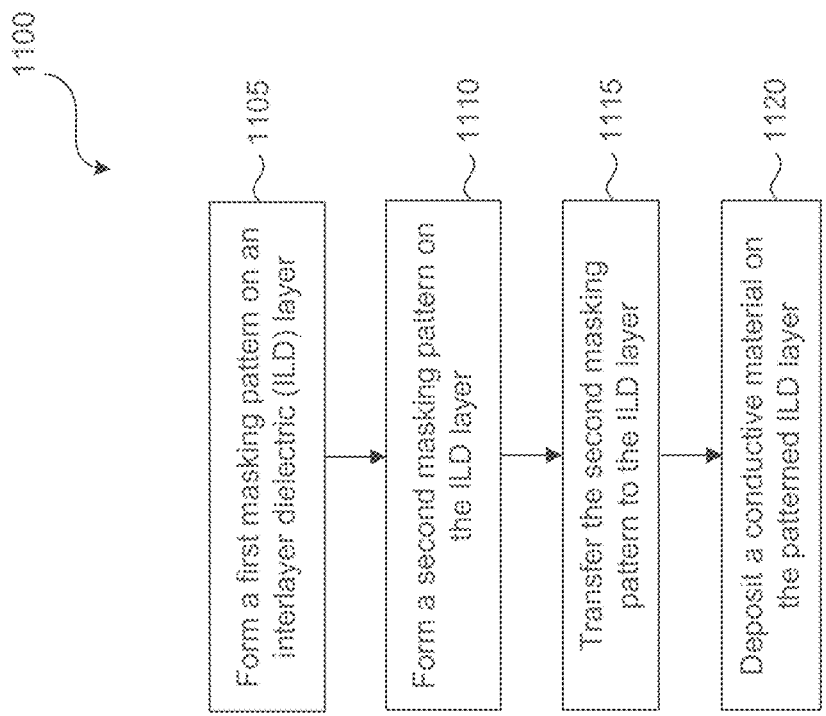
FIG. 11 is a flow diagram of a method for fabricating an interconnect layer with a layout of metal interconnects in an IC, in accordance with some embodiments.
Figure 14A:
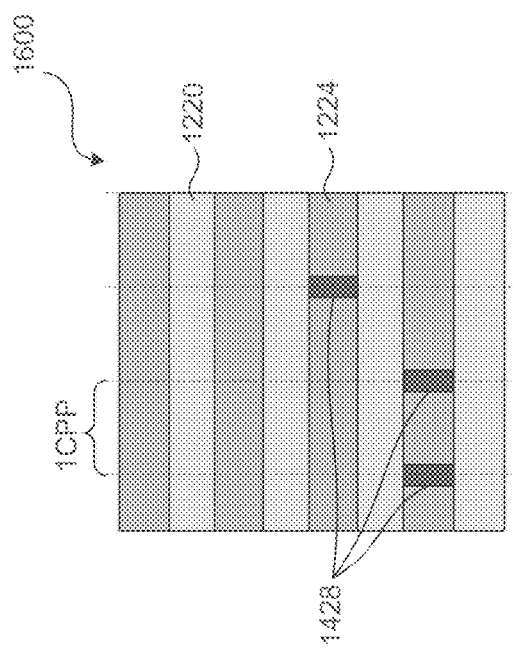
Figure 14B:
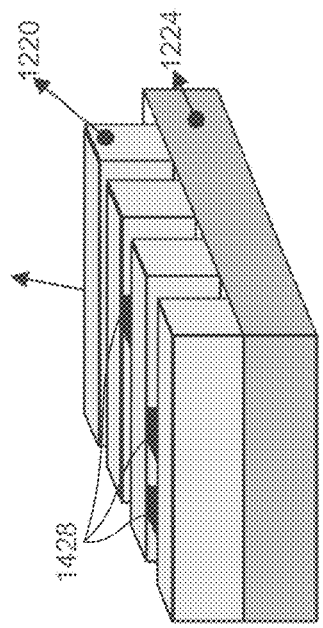
Figure 13A:
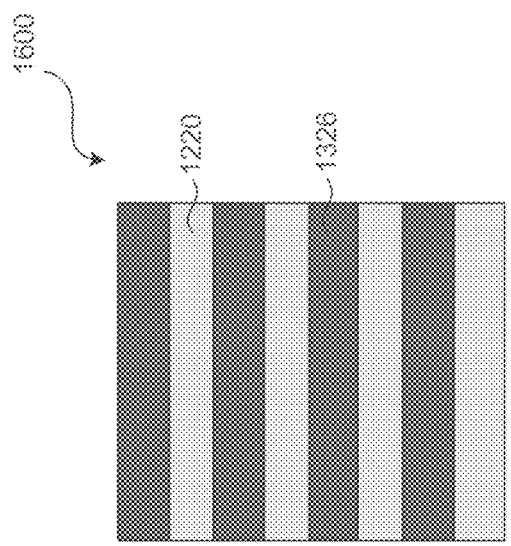
Figure 13B:
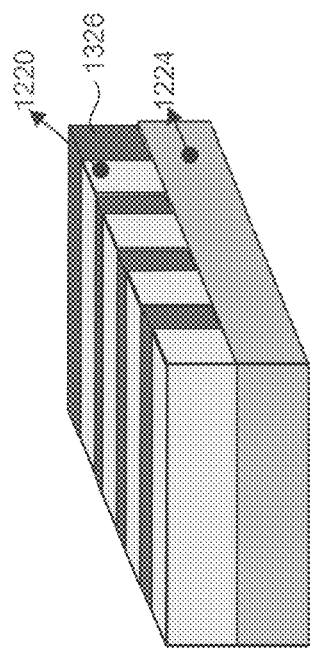
Figure 16A:
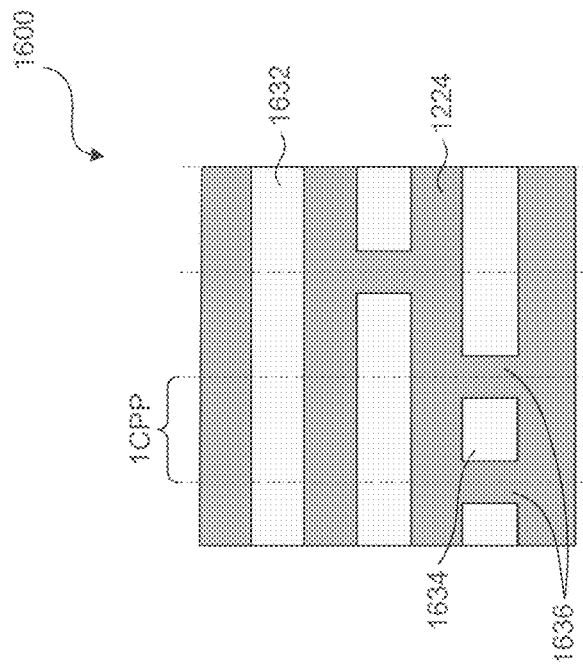
Figure 16B:
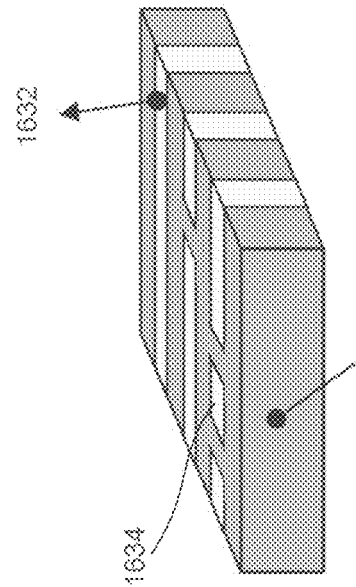
Figure 15A:
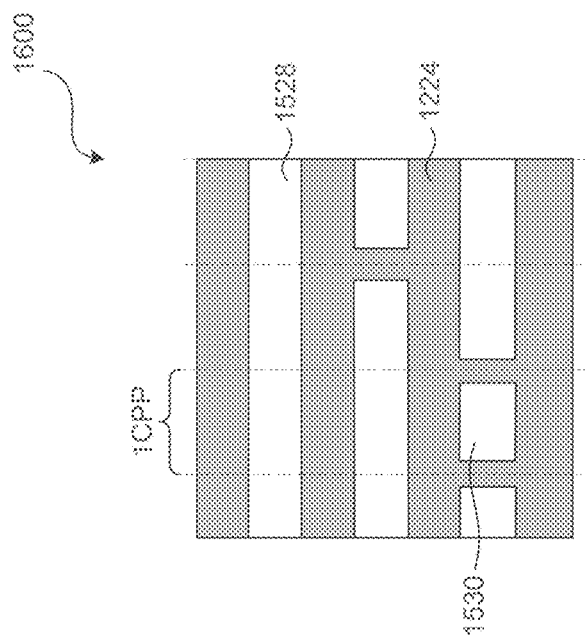
Figure 15B:
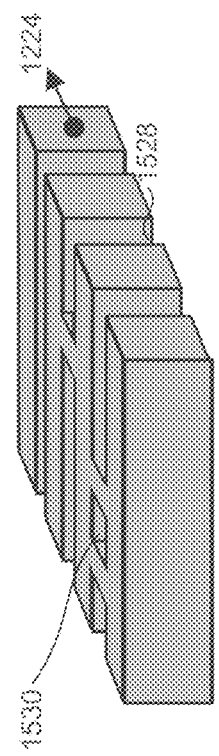

FIG. 11 is a flow diagram of a method 1100 for fabricating an interconnect layer from a layout of metal interconnects, such as described with reference to FIGS. 2A-2B, according to some embodiments. For illustrative purposes, the operations illustrated in method 1100 will be described with reference to the example fabrication process for fabricating interconnect layer 1600 as illustrated in FIGS. 12A-16A and 12B-16B. FIGS. 12A-16A and 12B-16B are plan views and isometric views, respectively, of interconnect layer 1600 with metal interconnects 1632 at various stages of its fabrication process. Operations can be performed in a different order or not performed depending on specific applications. It should be noted that method 1100 may not produce a complete interconnect layer 1600. Accordingly, it is understood that additional processes can be provided before, during, and after method 700, and that some other processes may only be briefly described herein. Elements in FIGS. 12A-16A and 12B-16B with the same annotations as elements in FIGS. 2A-2B are described above.

The above disclosed layout of metal interconnects (e.g., layouts 200, 210, 600, and/or 700) can be formed in an interconnect layer using method 1100.

In operation 1105, a first masking pattern is formed on an interlayer dielectric (ILD) layer. For example, as described with reference to FIGS. 12A-12B, a first masking pattern 1220 can be formed on ILD layer 1224. ILD layer 1224 can be formed on contact structures (e.g., source/drain contact structures and/or gate contact structures) of active devices of an IC. ILD layer 224 can include a dielectric material, such as a oxide, a nitride, or a combination thereof. First masking pattern 1220 can include a layer of patterned insulating material. The formation of first masking pattern 1220 can include depositing an insulating layer (e.g., a hard mask layer) of oxide or nitride on ILD layer 1224 and patterning the deposited insulating layer using lithography and etching processes. The pattern of first masking pattern 1220 can be formed using a photomask with a layout pattern similar to layout 100 (FIG. 1A) without the vias. The exposed regions on ILD layer 1224 regions can correspond to the metal interconnect regions of layout 100.

In operation 1110, a second masking pattern is formed on the ILD layer. For example, as described with reference to FIGS. 13A-13B and 14A-14B, a second masking pattern 1428 (FIG. 14A-14B) can be formed on ILD 1224. The formation of second masking pattern 1428 can include blanket depositing an insulating layer (e.g., a hard mask layer) of oxide or nitride on first masking pattern 1220 and exposed regions of ILD layer 1224, chemical mechanical polishing the deposited insulating layer to form layer 1326 (FIG. 13A-13B), and patterning layer 1326 using lithography and etching processes. The pattern of second masking pattern 1428 can be formed using a photomask with a layout pattern similar to layout 200 (FIG. 2A) without the vias. The exposed regions on ILD layer 1224 can correspond to the regions of active and floating metal portions of layout 200 and the insulating portions of second masking pattern 1428 can correspond to insulating portions 203-1 and/or 203-2 of layout 200. Insulating portions of second masking pattern 1428 can form metal cuts 1636 (FIGS. 16A-16B) similar to metal cuts 203-1 and/or 203-2 described with reference to FIG. 2A in metal interconnects 1632 (FIGS. 16A-16B) of interconnect layer 1600 in subsequent processes, as described below.

In operation 1115, the second masking pattern is transferred to the ILD layer. For example, as described with reference to FIGS. 15A-15B, second masking pattern 1428 can be transferred to ILD layer 1224 by one or more etching processes (e.g., dry or wet etching processes) to form etched regions 1528.

In operation 1120, a layer of conductive material is deposited on the patterned ILD layer. For example, as described with reference to FIGS. 16A-16B, a layer of conductive material, such as titanium (Ti), tantalum (Ta), nickel (Ni), tungsten (W), cobalt (Co), copper (Cu), and/or other suitable materials can be deposited on the structure of FIG. 15A. The deposition of the layer of conductive material can be followed by a chemical mechanical polishing of the deposited layer to form metal interconnects 1632 of FIGS. 16A-16B. Portion 1634 of metal interconnects 1632 can correspond to the floating metal portions (e.g., 201-1, 202-1, and/or 601-605) described with reference to FIGS. 2A and 6. Portions 1636 of ILD layer 1224 can correspond to the metal cuts (e.g., 203-1 and/or 203-2) described with reference to FIGS. 2A and 6. Following the formation of metal interconnects 1632, vias similar to those described with reference to FIGS. 2A and/or 6 can be formed on metal interconnects 1632.

Though the present disclosure has been described with metal interconnects, the interconnects can comprise one or more metal alloys or any suitable conductive material.

Embodiments of the present disclosure describe methods to remove and/or electrically disconnect redundant metal portions of metal interconnects to form active metal portions of metal interconnects in a circuit layout to reduce parasitic capacitance of an IC and improve the speed of the IC. The methods can be performed at the design stage of the circuit layout for the IC. In some embodiments, the electrically disconnecting of redundant metal portions of metal interconnects can result in the formation of small floating metal portions positioned among the active metal portions in the circuit. In some embodiments, the removal of redundant metal portions can result in the formation of active metal portions with sufficiently long length. The formation of floating metal portions can allow more redundant metal portions to be electrically disconnected from the active metal portions, and the removal of redundant metal portions can allow the subsequent self-alignment process to be performed efficiently.

Accordingly, metal interconnects formed by the disclosed methods can align along the horizontal direction, and the metal interconnects can have structures, shapes, and/or dimensions as designed. Further, the disclosed methods help to maintain CD uniformity of the circuit and to reduce the parasitic capacitance of the IC, which can help to increase the device speed of the IC and reduce the power consumption of the IC. Thus, device performance can be improved by the disclosed methods. In some embodiments, by using the disclosed methods in the back end of the line (BEOL) stage of IC fabrication, capacitance of the circuit can be reduced by up to about 50% and the speed of the circuit can be increased by about 5 to about 10 times compared to circuits having metal interconnects patterned using traditional redundant metal portion removal methods. Further, embodiments of the disclosed methods can be used in the fabrication of devices at various process technology nodes, such as 5 nm and 7 nm fabrication processes.

In some embodiments, a method for forming metal interconnects in an integrated circuit (IC) includes placing a metal interconnect in a layout area, determining a location of a redundant portion of the metal interconnect, and reducing, at the location, the length of the metal interconnect by a length of the redundant portion to form one or more active portions of the metal interconnect. The length of the redundant portion is a function of a distance between adjacent gate structures of the IC. The method further includes forming the one or more active portions on an interlayer dielectric (ILD) layer of the IC and forming vias on the one or more active portions, wherein the vias are positioned about 3 nm to about 5 nm away from an end of the one or more active portions.

In some embodiments, a method for forming metal interconnects in an integrated circuit (IC) includes placing a metal interconnect in a circuit layout area, determining locations and lengths of a plurality of active portions of the metal interconnect, and placing, at the locations, the plurality of active portions. The lengths are each greater than or equal to a predetermined value and at least one of the placing and determining is performed by a processor.

In some embodiments, a non-transitory computer-readable medium having computer-executable program stored thereon that, when executed by a processor, causes the processor to perform operations for optimizing lengths of metal interconnects in an integrated circuit (IC) includes placing a metal interconnect in a layout area, determining a location of a redundant portion of the metal interconnect, and reducing, at the location, the length of the metal interconnect by a length of the redundant portion to form one or more active portions of the metal interconnect. The length of the redundant portion is less than or equal to a predetermined value and at least one of the placing, determining, and reducing is performed by a processor.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method for forming metal interconnects in an integrated circuit (IC), the method comprising:
    placing a metal interconnect in a layout area;
    determining a location of a redundant portion of the metal interconnect;
    reducing, at the location, the length of the metal interconnect by a length of the redundant portion to form one or more active portions of the metal interconnect, wherein the length of the redundant portion is a function of a distance between adjacent gate structures of the IC;
    forming the one or more active portions on an interlayer dielectric (ILD) layer of the IC; and
    forming vias on the one or more active portions, wherein the vias are positioned about 3 nm to about 5 nm away from an end of the one or more active portions.

2. The method of claim 1, wherein the determining the location of the redundant portion comprises determining whether the redundant portion is at a lateral distance away from vias of the metal interconnect.

3. The method of claim 1, wherein the length of the redundant portion is less than or equal to the distance between centerlines of adjacent gate structures.

4. The method of claim 1, wherein the reducing the length of the metal interconnect comprises inserting a metal cut to electrically disconnect the redundant portion from the one or more active portions of the metal interconnect.

5. The method of claim 1, wherein the reducing the length of the metal interconnect comprises removing the redundant metal portion from the metal interconnect.

6. The method of claim 1, wherein a length of at least one of the one or more active portions is about twice the distance between adjacent gate structures.

7. The method of claim 1, further comprising placing another metal interconnect in the layout area, wherein the another metal interconnect self-aligns to the metal interconnect.

8. A method for forming metal interconnects in an integrated circuit (IC), the method comprising:
    placing a metal interconnect in a circuit layout area;
    determining locations and lengths of a plurality of active portions of the metal interconnect; and
    placing, at the locations, the plurality of active portions, wherein the lengths are each greater than or equal to a predetermined value, and
    wherein at least one of the placing and determining is performed by a processor.

9. The method of claim 8, wherein the determining the locations of the plurality of active portions comprises determining whether the plurality of active portions overlap with vias of the metal interconnect.

10. The method of claim 8, wherein the predetermined value includes twice a spacing of about a cell poly pitch (CPP).

11. The method of claim 8, further comprising placing another metal interconnect in the circuit layout area, wherein the metal interconnect is for self-alignment of the another metal interconnect.

12. The method of claim 8, wherein the placing the plurality of active portions comprises determining the lengths of the plurality of active portions bi-directionally along an extending direction of the plurality of active portions based on locations of the vias.

13. The method of claim 8, wherein an end-to-end distance between two adjacent active portions from among the plurality of active portions is at least a spacing of about a cell poly pitch (CPP).

14. A non-transitory computer-readable medium having computer-executable program code stored thereon that, when executed by a processor, causes the processor to perform operations for optimizing lengths of metal interconnects in an integrated circuit (IC), the operations comprising:
    placing a metal interconnect in a layout area;
    determining a location of a redundant portion of the metal interconnect; and
    reducing, at the location, the length of the metal interconnect by a length of the redundant portion to form one or more active portions of the metal interconnect, wherein the length of the redundant portion is less than or equal to a predetermined value.

15. The non-transitory computer-readable medium of claim 14, wherein the determining the location of the redundant portion comprises determining whether the redundant portion is at a lateral distance away from vias of the metal interconnect.

16. The non-transitory computer-readable medium of claim 14, wherein the predetermined value includes a spacing of about a cell poly pitch (CPP).

17. The non-transitory computer-readable medium of claim 14, wherein the reducing the length of the metal interconnect comprises inserting a metal cut to disconnect the redundant portion from the one or more active portions of the metal interconnect.

18. The non-transitory computer-readable medium of claim 14, the operations further comprising placing another metal interconnect in the layout area, wherein the metal interconnect is for self-alignment of the another metal interconnect.

19. The non-transitory computer-readable medium of claim 14, wherein the reducing the length of the metal interconnect comprises removing the redundant metal portion from the one or more active portions of the metal interconnect.

20. The non-transitory computer-readable medium of claim 14, wherein a length of at least one of the one or more active portions is at least twice a length of about a cell poly pitch (CPP).

* * * * *